US008716113B2

(12) United States Patent
Saito et al.

(10) Patent No.: US 8,716,113 B2
(45) Date of Patent: May 6, 2014

(54) CRYSTALLINE SEMICONDUCTOR FILM MANUFACTURING METHOD AND CRYSTALLINE SEMICONDUCTOR FILM MANUFACTURING APPARATUS

(75) Inventors: Toru Saito, Osaka (JP); Hiroshi Yoshioka, Chiba (JP); Sadayoshi Hotta, Osaka (JP)

(73) Assignees: Panasonic Corporation, Osaka (JP); Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 13/295,317

(22) Filed: Nov. 14, 2011

(65) Prior Publication Data

US 2012/0064701 A1 Mar. 15, 2012

Related U.S. Application Data

(63) Continuation of application No. PCT/JP2011/003642, filed on Jun. 27, 2011.

(30) Foreign Application Priority Data

Jul. 16, 2010 (JP) .................................. 2010-162075

(51) Int. Cl.
*H01L 21/20* (2006.01)
*H01L 21/36* (2006.01)
*H01L 21/02* (2006.01)

(52) U.S. Cl.
CPC .... *H01L 21/02675* (2013.01); *H01L 21/02691* (2013.01); *H01L 21/2026* (2013.01)
USPC ....................................................... 438/487

(58) Field of Classification Search
CPC ................... H01L 21/02675; H01L 21/02691; H01L 21/2026
USPC ....... 438/486, 487, FOR. 206, 478, 482, 795, 438/798; 219/121.6
See application file for complete search history.

(56) References Cited

U.S. PATENT DOCUMENTS 5,706,076 A * 1/1998 Takeda ............................ 355/53
6,341,042 B1 1/2002 Matsunaka et al.
(Continued)

FOREIGN PATENT DOCUMENTS

CN 100568447 12/2009
JP 4-171717 6/1992
(Continued)

OTHER PUBLICATIONS

International Search Report of PCT/JP2011/003642, dated Jun. 27, 2011.

(Continued)

*Primary Examiner* — Colleen Matthews
*Assistant Examiner* — Quovaunda V Jefferson
(74) *Attorney, Agent, or Firm* — Greenblum & Bernstein, P.L.C.

(57) ABSTRACT

A semiconductor film manufacturing method includes: forming a metal layer above the substrate; forming a gate electrode in each of pixels by patterning a metal layer; forming a gate insulating firm on the gate electrode; forming an amorphous semiconductor film on the gate insulating film; and crystallizing the amorphous semiconductor film by irradiating the amorphous semiconductor film with a laser beam, and a laser irradiation width of the laser beam corresponds to n times a width of each pixel (n is an integer of 2 or above), a laser energy intensity is higher in one end portion of the laser irradiation width than in the other end portion, and in the crystallizing, the laser energy intensity of the laser beam is inverted in increments of n pixels, alternately between one of the end portions of the laser irradiation width of the laser beam and the other end portion.

3 Claims, 18 Drawing Sheets

(56) References Cited

U.S. PATENT DOCUMENTS

| | | | |
|---|---|---|---|
| 6,426,245 | B1 | 7/2002 | Kawasaki et al. |
| 6,624,013 | B2 | 9/2003 | Kawasaki et al. |
| 6,844,249 | B2 | 1/2005 | Kawasaki et al. |
| 7,129,124 | B2 * | 10/2006 | Hongo et al. ............ 438/166 |
| 7,223,504 | B2 | 5/2007 | Lee et al. |
| 7,474,679 | B2 | 1/2009 | Park |
| 7,691,545 | B2 | 4/2010 | Lee et al. |
| 7,811,910 | B2 | 10/2010 | Hongo et al. |
| 8,173,977 | B2 | 5/2012 | Tanaka |
| 2002/0146874 | A1 | 10/2002 | Kawasaki et al. |
| 2004/0092061 | A1 | 5/2004 | Kawasaki et al. |
| 2005/0151146 | A1 | 7/2005 | Lee et al. |
| 2005/0170569 | A1 | 8/2005 | Yazaki et al. |
| 2006/0176920 | A1 | 8/2006 | Park |
| 2007/0015069 | A1 | 1/2007 | Lee et al. |
| 2008/0081298 | A1 | 4/2008 | Tanaka |
| 2008/0227274 | A1 | 9/2008 | Hongo et al. |

FOREIGN PATENT DOCUMENTS

| | | |
|---|---|---|
| JP | 11-125839 | 5/1999 |
| JP | 2001-044133 | 2/2001 |
| JP | 2001-085703 | 3/2001 |
| JP | 2003-188112 | 7/2003 |
| JP | 2004-087620 | 3/2004 |
| JP | 2005-217210 | 8/2005 |
| JP | 2005-243747 | 9/2005 |
| JP | 2005-259809 | 9/2005 |
| JP | 2008-112981 | 5/2008 |
| JP | 2008-218862 | 9/2008 |
| JP | 2009-059988 | 3/2009 |
| JP | 2009-283691 | 12/2009 |
| KR | 10-2000-0053658 | 8/2000 |
| KR | 10-2006-0090055 | 8/2006 |

OTHER PUBLICATIONS

International Search Report of PCT/JP2011/003642, dated Jul. 19, 2011.
Japan Office action, mail date is Aug. 20, 2013.
Notice of Allowance from Korea Intellectual Property Office (KIPO) in Korean Patent Application No. 10-2012-7000241, dated Sep. 4, 2013.
Office Action from The Patent Office of the People's Republic of China in Chinese Patent Application No. 201180002849.7, dated Dec. 26, 2013, along with an English language translation thereof.

* cited by examiner

FIG. 9B

Resolution and the number of pixels (pieces)

| Resolution | Long-side number of pixels | Short-side number of pixels (A) |
|---|---|---|
| HD | 1366 | 768 |
| FHD | 1920 | 1080 |
| 4k2k | 3840 | 2160 |

Panel size and long/short-side dimension (mm)

| Panel size | Long-side dimension | Short-side dimension (B) |
|---|---|---|
| 42 inches | 931 | 524 |
| 58 inches | 1285 | 723 |
| 65 inches | 1440 | 811 |

Laser method and maximum laser beam width (mm)

| Laser method | Beam width (C) |
|---|---|
| Solid CW laser | 5 |
| Solid pulse laser | 300 |
| Excimer laser (ELA) | 730 |

# CRYSTALLINE SEMICONDUCTOR FILM MANUFACTURING METHOD AND CRYSTALLINE SEMICONDUCTOR FILM MANUFACTURING APPARATUS

CROSS REFERENCE TO RELATED APPLICATIONS

This is a continuation application of PCT Patent Application No. PCT/JP2011/003642 filed on Jun. 27, 2011, designating the United States of America, which is based on and claims priority of Japanese Patent Application No. 2010-162075 filed on Jul. 16, 2010. The entire disclosures of the above-identified applications, including the specifications, drawings and claims are incorporated herein by reference in their entirety.

BACKGROUND OF THE INVENTION (1) Field of the Invention

The present invention relates to a crystalline semiconductor film manufacturing method and a crystalline semiconductor film manufacturing apparatus.

(2) Description of the Related Art

A thin-film transistor called TFT is used for an active matrix driven display apparatus such as a liquid crystal display apparatus or an organic electroluminescence (EL) display apparatus.

In the thin-film transistor, a semiconductor layer which includes silicon or the like and is to be a channel layer is generally formed of an amorphous semiconductor film or a crystalline semiconductor film; however, it is preferable that a semiconductor layer that is to be the channel layer be formed of the crystalline semiconductor film whose mobility is higher than that of the amorphous semiconductor film. Generally, the crystalline semiconductor film is formed by forming an amorphous semiconductor film first and then crystallizing the amorphous semiconductor film.

Methods of forming the crystalline semiconductor film by crystallizing the amorphous semiconductor film includes a laser annealing method such as an excimer laser annealing (ELA) method.

A conventional laser annealing method is disclosed in, for example, Patent Reference 1 (Japanese Unexamined Patent Application Publication No. 4-171717) and Patent Reference 2 (Japanese Unexamined Patent Application Publication No. 11-125839).

The laser beam irradiation method disclosed in Patent Reference 1 involves rotating, relative to each other, the semiconductor substrate and the excimer layer beam. With this, even if the energy density distribution of the laser beam is uneven, the unevenness is offset by the rotation described above, thus equalizing the energy distribution within the surface irradiated with the laser beam.

In addition, the laser annealing method disclosed in Patent Reference 2 is a method that involves swinging a position of the laser beam in a beam scanning direction with each shot. This allows averaging an intensity distribution of the laser beam projected onto the substrate without bias.

It can be considered that crystallizing the amorphous semiconductor film using the laser annealing methods disclosed in Patent References 1 and 2 results in a uniform energy distribution of the laser beam projected onto the amorphous semiconductor film, thus allowing obtaining the crystalline semiconductor film that is uniformly crystallized.

However, in the display apparatus described above which is expected of high display performance such as high image quality, there is a problem of failing to obtain the crystalline semiconductor film having a sufficient uniformity even when using the laser annealing methods of the Patent References 1 and 2. Particularly, the display apparatus described above includes a TFT array substrate in which a plurality of TFTs are provided for each pixel, but the conventional laser annealing method does not allow suppressing minor variations of TFT characteristics between pixels. This presents a problem of being unable to realize a display apparatus having higher display performance.

In addition, as the conventional layer annealing method, for example, methods as shown in FIGS. 15 to 17 are also used. FIG. 15 is a diagram showing a long-axis profile and a short-axis profile of a layer beam in the conventional layer annealing method.

The light intensity distribution of the laser beam shown in FIG. 15 has: a flat-topped laser energy intensity in the long axis, and a Gaussian laser energy intensity in the short axis.

FIGS. 16A and 16B are diagrams each showing a laser beam scanning method in the conventional laser annealing method.

As shown in FIGS. 16A and 16B, the conventional laser annealing method is a method in which: in the TFT array substrate 200 in which a plurality of pixels 20 are arranged in a matrix, the amorphous semiconductor film formed above the TFT array substrate is repeatedly irradiated with a laser beam having a light intensity distribution as shown in FIG. 16, per unit of a block made up of rows of pixels. For example, as shown in FIG. 16A, beam scanning is sequentially performed on a pair of two rows (two lines) each time, starting from the top, in order of first scanning, second scanning, (k−1)th scanning, and (k)th scanning.

In this processing, the laser beam scanning is repeated as shown in FIG. 17, using a laser beam having the light intensity shown in FIG. 15. In other words, the amorphous semiconductor film is crystallized by irradiating, with the laser beam, the amorphous semiconductor film above the TFT array substrate such that a column direction of the pixels coincides with a long-axis direction of the light intensity distribution of the laser beam. Note that FIG. 17 shows two TFTs for each pixel 20, and also shows source and drain electrodes for each of the TFTs; however, this illustration is intended to clearly indicate the position of the TFTs in the pixel, and therefore when actually performing the laser annealing as described above, neither the source electrode nor the drain electrode is formed yet, nor is the channel layer patterned yet.

Conventionally, the amorphous semiconductor film is thus crystallized, but in the laser annealing method shown in FIG. 17, the laser energy intensity, as shown in FIG. 15, is not uniform in a top portion of the light intensity distribution in the long axis of the laser beam. Because of this, when performing laser irradiation on the amorphous semiconductor film, the laser energy intensity is higher in one end portion of a laser irradiation width than in the other end portion of the laser irradiation width.

This accordingly causes difference between an intensity of the laser energy projected onto pixels in a bottom line of one block an and an intensity of the laser energy projected onto pixels in a top line of a block next to the one block. This varies laser energy intensity, with an extreme difference as shown in FIG. 17, between the pixels in the bottom line of the one block and the pixels in the top line of the next block. In other words, the energy intensity is not continuous when the intensity distribution of the energy projected onto the entire amorphous semiconductor film is viewed in a column direction of the pixels.

As a result, in the crystalline semiconductor film formed by laser irradiation, difference is caused in crystal grain size between the crystalline semiconductor film formed on the gate electrode corresponding to the pixels in the bottom line of the one block and the crystalline semiconductor film formed on the gate electrode corresponding to the pixels in the top line of the next block. This variation in grain size is manifested as variations in TFT characteristics in a boundary between the one block and the next block, and causes a problem of a stripe or line appearing in the display image of each block (block boundary) when viewed as the entire display apparatus.

Note that no matter what is done to flatten a top portion of the light intensity distribution in the long axis shown in FIG. 15, that is, even with attempts to remove the difference in laser energy intensity at both ends of the top portion, such difference will be caused in practice even if only a little.

Thus, the conventional laser annealing method has a problem of not being able to remove the variation in TFT characteristics between pixels.

SUMMARY OF THE INVENTION

The present invention is conceived in view of the above problem, and an object of the present invention is to provide a crystalline semiconductor film manufacturing method and a crystalline semiconductor film manufacturing apparatus which allow suppressing variation in TFT characteristics.

To solve the above problem, a crystalline semiconductor film manufacturing method according to an implementation of the present invention includes: forming a metal layer above a substrate; forming a plurality of gate electrodes by patterning the metal layer such that each of pixels arranged in a matrix includes at least one of the gate electrodes; forming a gate insulating film on the gate electrodes; forming an amorphous semiconductor film on the gate insulating film; and forming a crystalline semiconductor film by irradiating, by scanning, the amorphous semiconductor film with a predetermined laser beam, so as to crystallize the amorphous semiconductor film, and a laser irradiation width that is a width of the predetermined laser beam for the scanning corresponds to n times a width of the pixel where n is an integer equal to or above 2, a laser energy intensity is higher in one end portion of the laser irradiation width than in the other end portion of the laser irradiation width, and in the forming of a crystalline semiconductor film, the laser energy intensity of the predetermined laser beam is inverted in increments of n pixels, alternately between the one end potion and the other end portion of the laser irradiation width.

With the crystalline semiconductor film manufacturing method and the crystalline semiconductor film manufacturing apparatus according to the present invention, it is possible to obtain the crystalline semiconductor film which allows suppressing variation in TFT characteristics.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 9B is a diagram for describing a relationship between resolution and the number of pixels of the display panel, a relationship between a panel size and a long side dimension or a short side dimension of the display panel, and a relationship between a laser method and a maximum laser beam width;

DESCRIPTION OF THE PREFERRED EMBODIMENTS

Figure 1:
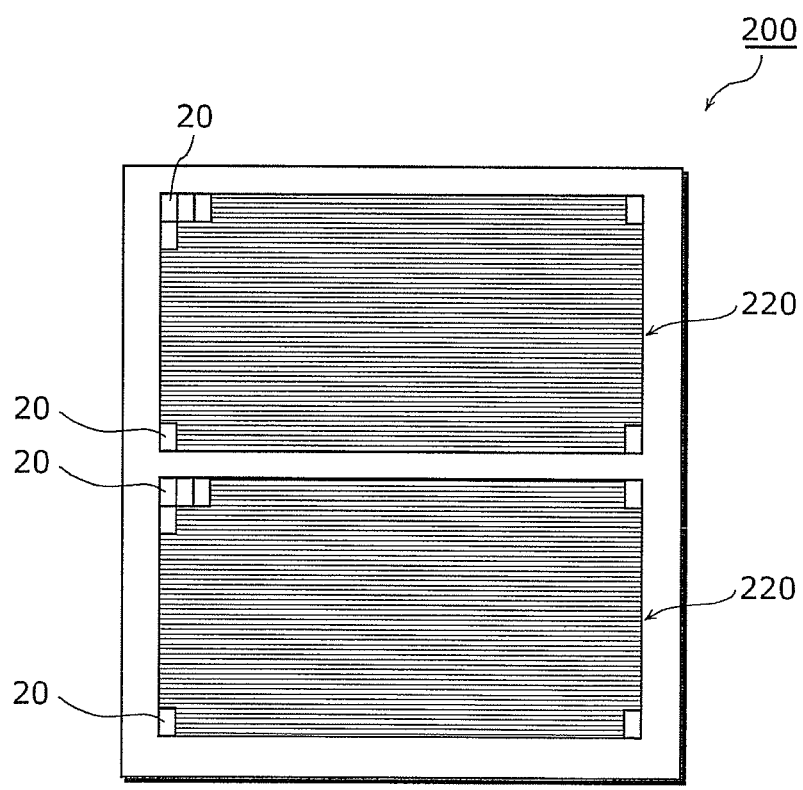
FIG. 1 is a plan view of a thin-film transistor array substrate on which a thin-film transistor device having a crystalline semiconductor film according to a first embodiment of the present invention is formed.

A crystalline semiconductor film manufacturing method according to an aspect of the present invention includes: forming a metal layer above a substrate; forming a plurality of gate electrodes by patterning the metal layer such that each of pixels arranged in a matrix includes at least one of the gate electrodes; forming a gate insulating film on the gate electrodes; forming an amorphous semiconductor film on the gate insulating film; and forming a crystalline semiconductor film by irradiating, by scanning, the amorphous semiconductor film with a predetermined laser beam, so as to crystallize the amorphous semiconductor film, and a laser irradiation width that is a width of the predetermined laser beam for the scanning corresponds to n times a width of the pixel where n is an integer equal to or above 2, a laser energy intensity is higher in one end portion of the laser irradiation width than in the other end portion of the laser irradiation width, and in the forming of a crystalline semiconductor film, the laser energy intensity of the predetermined laser beam is inverted in increments of n pixels, alternately between the one end potion and the other end portion of the laser irradiation width.

According to this aspect, when forming the crystalline semiconductor film by crystallizing the amorphous semiconductor film, laser irradiation is performed per block, based on one block made up of n pixels (in increments of n pixels), using a laser beam having an irradiation width corresponding to n times the number of pixels. In this processing, the laser irradiation is performed such that the energy intensity of the laser beam is inverted per block (in increments of n pixels), alternately between one and the other end portions of the laser irradiation width.

Accordingly, this allows equalizing the intensity of the laser energy projected onto the pixels in the bottom line of one block and the intensity of the laser energy projected onto pixels in a top line of a block next to the one block.

As a result, the crystalline semiconductor film formed on the gate electrode in a pixel in the bottom line of the one block and the crystalline semiconductor film formed on the gate electrode in a pixel in the top line of the next block are formed by laser irradiation at almost equal laser energy intensity.

Thus, it is possible to form, in almost the same grain size, the crystalline semiconductor film in the bottom line of the one block and the crystalline semiconductor film in the top line of the next block. This accordingly allows suppressing variation in TFT characteristics in the entire substrate.

In addition, a crystalline semiconductor film manufacturing method according to another aspect of the present invention includes: forming a metal layer above a substrate; forming a plurality of gate electrodes by patterning the metal layer such that each of pixels arranged in a matrix includes at least one of the gate electrodes; forming a gate insulating film on the gate electrodes; forming an amorphous semiconductor film on the gate insulating film; and forming a crystalline semiconductor film by irradiating, by scanning, the amorphous semiconductor film with a predetermined laser beam, so as to crystallize the amorphous semiconductor film, and a laser irradiation width that is a width of the predetermined laser beam for the scanning corresponds to n times a width of the pixel where n is an integer equal to or above 2, a laser energy intensity is higher in one end portion of the laser irradiation width than in the other end portion of the laser irradiation width, the pixel includes the at least one of the gate electrodes at a position closer to one end portion of the pixel from a virtual pixel center line of the pixel, the virtual center line running along a scanning direction of the predetermined laser beam, the pixel includes the at least one of the gate electrodes, for each laser irradiation width of the predetermined laser beam, at a position closer to the other end portion of the pixel, and in the forming of a crystalline semiconductor film, the laser energy intensity of the predetermined laser beam is inverted in increments of n pixels, alternately between the one end portion and the other end portion of the laser irradiation width.

According to this aspect, the gate electrode included in a pixel in the bottom line of the laser beam irradiation width and the gate electrode included in a pixel in the top line of the next laser beam irradiation width are provided at a position equidistant from a position of a boundary between laser irradiation widths of the laser beam. Such a pixel layout allows performing laser irradiation, at almost the same laser energy intensity, on the amorphous semiconductor film on the gate electrodes in the entire pixel region, thus allowing forming the crystalline semiconductor film whose grain size has high in-plane uniformity.

Furthermore, in the crystalline semiconductor film manufacturing method according to the aspect or the other aspect of the present invention, it is preferable that in the forming of a crystalline semiconductor film, when performing laser irradiation on the amorphous semiconductor film, the amorphous semiconductor film be irradiated with the predetermined laser beam at a constant scanning speed in a region in which the amorphous semiconductor is formed.

This allows irradiating the amorphous semiconductor film with a laser beam at a constant laser energy intensity per unit time, thus causing a constant temperature rise in the amorphous semiconductor film by the laser irradiation. Accordingly, this allows further equalizing the grain size of the crystalline semiconductor film in the entire substrate, and thus allows further suppressing variation in TFT characteristics in the entire substrate.

In addition, a crystalline semiconductor film manufacturing apparatus according to an aspect of the present invention includes: a substrate holding unit which holds a substrate for forming an amorphous semiconductor film; a laser oscillation unit which oscillates a predetermined laser beam for crystallizing the amorphous semiconductor film formed above the substrate; an optical system unit which irradiates, at a predetermined laser irradiation width, a predetermined region of the amorphous semiconductor film with the predetermined laser beam oscillated from the laser oscillation unit; a scan control unit which controls a position of one of the substrate holding unit and the optical system unit such that the predetermined laser beam is projected onto the substrate in a relation relative to each other in the scanning; and a laser inversion control unit which inverts a laser energy intensity of the predetermined laser beam, and the predetermined laser irradiation width corresponds to n times a width of each of pixels where n is an integer equal to or above 2, the laser energy intensity is higher in one end portion of the laser irradiation width of the predetermined laser beam than in the other end portion of the laser irradiation width, and the laser inversion control unit performs inversion control on the laser energy intensity in increments of n pixels, alternately between the one end and the other end of the laser irradiation width.

According to this aspect, it is possible to invert the laser energy intensity in increments of n pixels, alternately between one end portion and the other end portion of the laser irradiation width.

Accordingly, this allows equalizing the intensity of the laser energy projected onto the pixels in the bottom line of one block and the intensity of the laser energy projected onto the top line of a block next to the one block.

Furthermore, in the crystalline semiconductor film manufacturing apparatus according to the aspect of the present invention, it is preferable that the optical system unit include a laser inversion unit which performs a normal output or an inverted output of the predetermined laser beam, and that the laser inversion control unit perform the inversion control by controlling the laser inversion unit.

According to this aspect, it is possible to perform a normal output or an inverted output of the laser beam intensity distribution, using the laser inversion unit. This allows performing laser irradiation on the amorphous semiconductor film in increments of n pixels, by inversely controlling the laser beam intensity distribution.

Furthermore, it is preferable that the crystalline semiconductor film manufacturing apparatus according to the aspect of the present invention include a rotation mechanism unit which rotates the substrate holding unit, and that the laser inversion control unit perform the inversion control by controlling the rotation mechanism unit.

According to this aspect, it is possible to rotate the substrate supporting unit through the rotation mechanism unit. This allows rotating the substrate on which the amorphous semiconductor film is formed. Accordingly, by half-rotating the substrate in increments of n pixels, it is possible to perform inversion control on the laser beam intensity distribution with respect to the amorphous semiconductor film.

First Embodiment

Hereinafter, a crystalline semiconductor film manufacturing method and a crystalline semiconductor film manufacturing apparatus according to a first embodiment of the present invention will be described with reference to the drawings. Note that each diagram in each embodiment is a schematic diagram for the description and therefore does not necessarily illustrate each embodiment strictly.

(Configuration of a Thin-Film Transistor Array Device)

First, a thin-film transistor device having a crystalline semiconductor film according to the first embodiment of the present invention is described with reference to the drawings.

FIG. 1 is a plan view of a thin-film transistor array substrate (TFT array substrate) in which the thin-film transistor device including the crystalline semiconductor film according to the first embodiment of the present invention is to be formed. In addition, FIG. 2 is a plan view showing a configuration of pixels in the TFT array substrate in FIG. 1.

As shown in FIG. 1, a TFT array substrate 200 is an active matrix substrate, and includes a display unit 220 made up of a plurality of pixels 20 arranged in a matrix. Note that FIG. 1 shows the TFT array substrate 200 in which two display units 220 are formed, and it is possible to obtain two TFT array substrates by cutting off this TFT array substrate 200. In addition, FIG. 1 shows only a part of the pixels 20 at one of the four corners of the display unit 220, but in practice, the pixels 20 are arranged in a matrix in the display unit 220.

Figure 2:
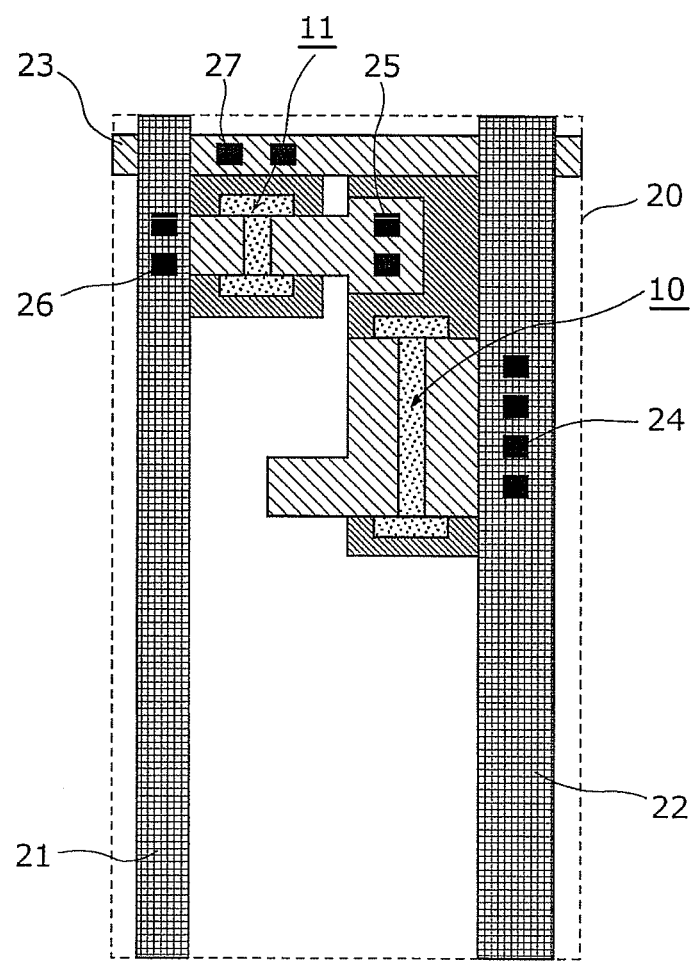
FIG. 2 is a plan view showing a configuration of pixels in a TFT array substrate in FIG. 1.

As shown in FIG. 2, each pixel 20 is marked off by a source line 21, a power supply line 22, and a gate line 23, and one pixel 20 (unit pixel) includes a driving TFT 10 and a switching TFT 11.

In the present embodiment, the driving TFT 10 is a driving transistor for driving an organic EL element (not shown), and the switching TFT 11 is a switching transistor for selecting a supply of a image signal to the pixel 20.

In addition, in the driving TFT 10, the drain electrode is electrically connected to the power supply line 22 via a contact 24, and the gate electrode is electrically connected to the drain electrode of the switching TFT 11 via a contact 25. Note that the source electrode of the driving TFT 10, although not shown, is electrically connected to a lower electrode of the organic EL element.

In addition, in the switching TFT 11, the source electrode is electrically connected to the source line 21 via a contact 26, and the gate electrode is electrically connected to the gate line 23 via a contact 27. The drain electrode of the switching TFT 11 is electrically connected to the gate electrode of the driving TFT 10. Note that the gate electrode of the driving TFT 10 and the power supply line 22 are provided to overlap with each other via an insulating film in a direction perpendicular to the substrate, to form a condenser (not shown).

In this configuration, when a gate signal is input into the gate line 23 to turn the switching TFT 11 into an ON state, a signal voltage supplied via the source line 21 is written into the condenser. Then, a held voltage, which is the voltage written into the condenser, is held through a period of one frame. This held voltage changes, in an analog state, a conductance of the driving TFT 10, thus causing a drive current corresponding to luminescence gradation to flow from an anode to a cathode of the organic EL element. This causes the organic EL element to produce luminescence, to display an image.

Figure 3:
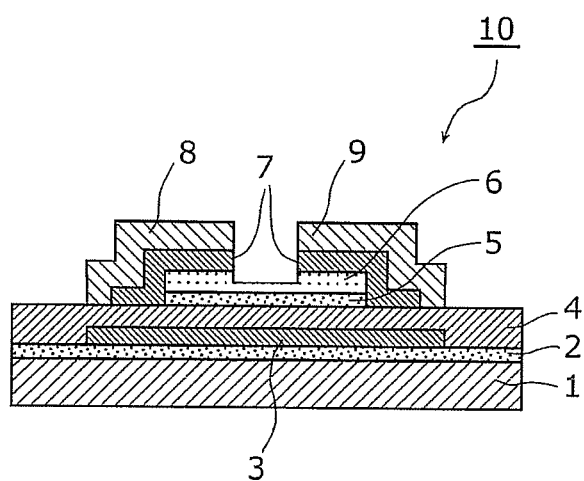
FIG. 3 is a cross-sectional view showing a configuration of a thin-film transistor device according to the first embodiment of the present invention.

Next, a configuration of the thin-film transistor device having the crystalline semiconductor film according to the first embodiment of the present invention is described with reference to FIG. 3. FIG. 3 is a cross-sectional view showing a configuration of the thin-film transistor device according to the first embodiment of the present invention. Note that FIG. 3 shows the configuration of the driving TFT 10 as the thin-film transistor device according to the first embodiment of the present invention, but the switching TFT 11 has the same configuration.

As shown in FIG. 3, the thin-film transistor device (driving TFT 10) according to the first embodiment of the present invention is a bottom gate thin film transistor device, and includes: an undercoat layer 2, a first gate electrode 3, a gate insulating film 4, a crystalline semiconductor film 5, and an amorphous semiconductor film 6, a pair of contact layers 7, a source electrode 8, and a drain electrode 9 that are serially formed above the substrate 1.

The substrate 1 is, for example, formed of a glass material such as silica glass.

The undercoat layer 2 is formed on the substrate 1 to prevent an impurity included in the substrate 1 from invading the semiconductor film in the upper layer, and is formed of, for example, a nitride film such as a silicon nitride film (SiN).

The gate electrode 3 is formed on the undercoat layer 2, and is formed of, for example, molybdenum tungsten (MoW), or the like.

The gate insulating film 4 is formed to cover the gate electrode 3, and is formed of, for example, a silicon dioxide ($SiO_2$), silicon nitride (SiN), or the like.

The crystalline semiconductor film 5 is formed on the gate insulating film 4, by crystallizing an amorphous semiconductor film. Crystals of the crystalline semiconductor film 5 include: fine crystals referred to as microcrystals having an average grain size of 10 nm to 100 nm, or polycrystals having an average grain size of 100 nm or above. In the present embodiment, the crystalline semiconductor film 5 is formed by crystallizing an amorphous silicon film, and has a microcrystalline structure of an average grain size of 40 nm to 60 nm. Note that the crystallization method is to be described later. In addition, the crystalline semiconductor film 5 may be mixed crystals including a noncrystalline structure and a crystalline structure.

The amorphous semiconductor film 6 is formed on the crystalline semiconductor film 5, and is formed of, for example, an amorphous silicon film or the like.

The pair of contact layers 7 is formed on the amorphous semiconductor film 6, and is formed of an amorphous semiconductor film including a high concentration of impurity. In the present embodiment, the contact layer 7 is an n-type semiconductor layer formed by doping an amorphous silicon film with phosphorus (P) as an impurity, and includes impurity of a high concentration of $1\times10^{19}$ (atm/cm$^3$) or above.

Each of the source electrode 8 and the drain electrode 9 is formed on each of the pair of the contact layers 7. Each of the source electrode 8 and the drain electrode 9 has a single layer structure or a multilayer structure formed of a conductive material, an alloy, and so on, and includes a material, for example, aluminum (Al), molybdenum (Mo), tungsten (W), copper (Cu), titanium (Ti), and chrome (Cr).

(Crystalline Semiconductor Film Manufacturing Method)

Next, the crystalline semiconductor film manufacturing method according to the first embodiment of the present invention will be described with reference to the drawings.

Figure 4:
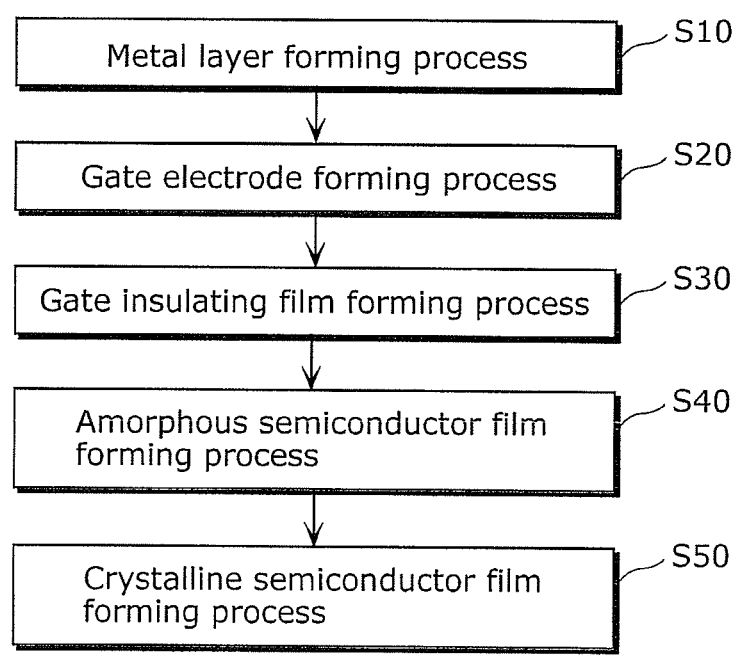
FIG. 4 is a flowchart of a crystalline semiconductor film manufacturing method according to the first embodiment of the present invention.

FIG. 4 is a flowchart of the crystalline semiconductor film manufacturing method according to the first embodiment of the present invention.

As shown in FIG. 4, the crystalline semiconductor film manufacturing method according to the first embodiment of the present invention includes: a metal layer forming process that is a first process (S10); a gate electrode forming process that is a second process (S20); a gate insulating film forming process that is a third process (S30); and an amorphous semiconductor film forming process that is a fourth process (S40); and a crystalline semiconductor film forming process that is a fifth process (S50).

Figure 5:
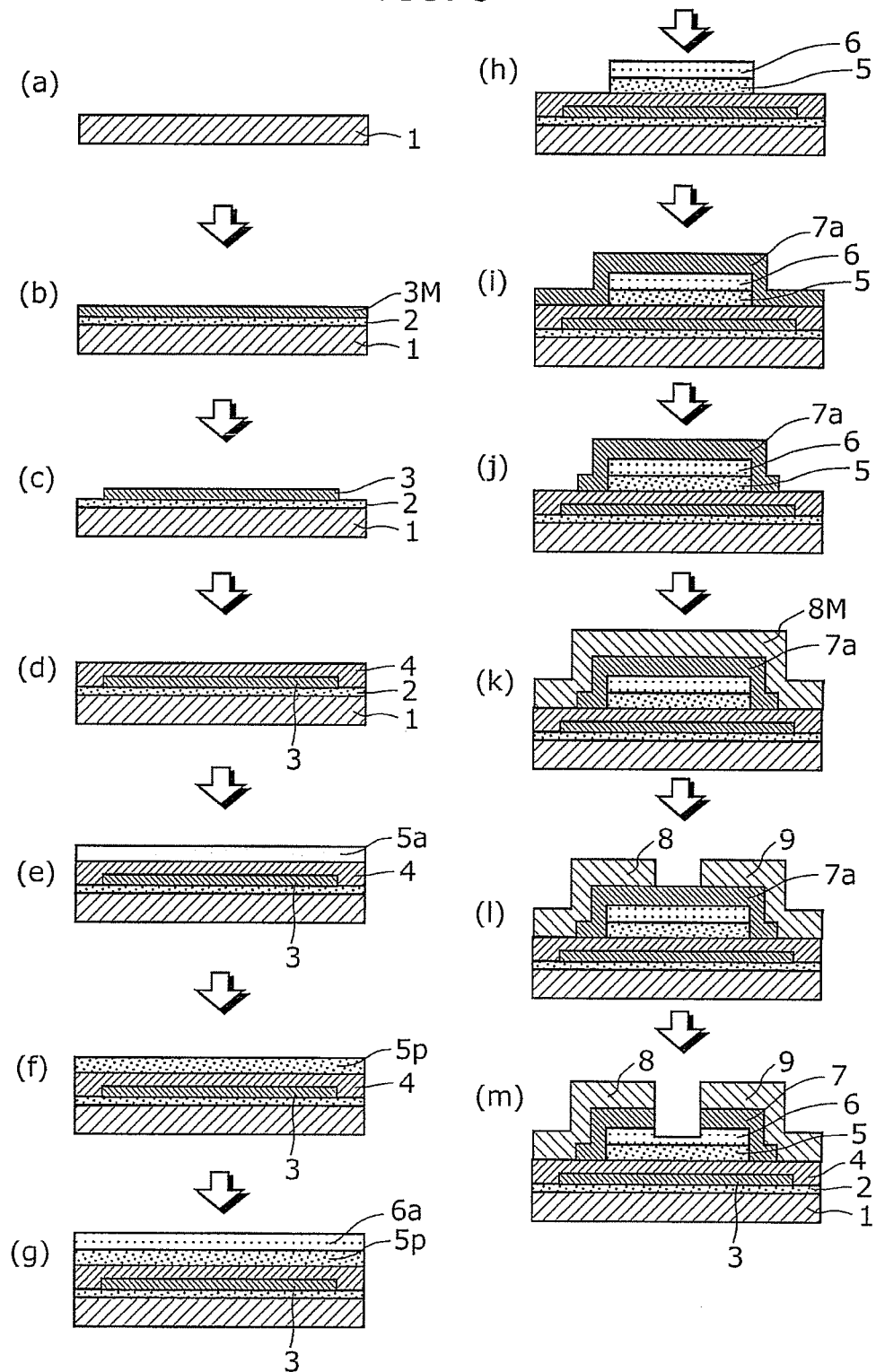
FIG. 5 is a cross-sectional view schematically showing each process in the crystalline semiconductor film manufacturing method according to the first embodiment of the present invention.

Next, a specific method for manufacturing the crystalline semiconductor film according to the first embodiment of the present invention is described in detail with reference to FIG. 5. FIG. 5 is a cross-sectional view schematically showing each process in the crystalline semiconductor film manufacturing method according to the first embodiment of the present invention. Note that FIG. 5 is a process cross-sectional view in manufacturing the thin-film transistor device.

First, as shown in (a) in FIG. 5, the substrate 1 made of a glass material such as silica glass is prepared.

Subsequently, on the substrate 1, the undercoat layer 2 including an insulating film such as a silicon nitride film is formed by plasma-enhanced chemical vapor deposition (plasma CVD) or the like.

Next, as shown in (b) in FIG. 5, after cleansing the undercoat layer 2 with pure water or the like, a gate metal layer 3M having a film thickness of approximately 50 nm is formed on the undercoat layer 2 (S10). In the present embodiment, the gate metal layer 3M including molybdenum tungsten (MoW) is formed by sputtering.

Next, as shown in (c) in FIG. 5, the gate electrode 3 having a predetermined shape is formed by patterning the gate metal layer 3M through photolithography and wet etching (S20). In this processing, a plurality of gate electrodes are formed above the substrate 1 such that each of the pixels arranged in a matrix includes at least one gate electrode.

Next, as shown in (d) in FIG. 5, the gate insulating film 4 including silicon dioxide and having a film thickness of approximately 100 nm is formed on the gate electrodes 3, to cover the gate electrodes 3 (S30). Note that the gate insulating film 4 can be formed by plasma CVD or the like.

Next, as shown in (e) in FIG. 5, an amorphous semiconductor film 5a formed as an amorphous silicon film and having a thickness of approximately 50 nm is formed on the gate insulating film 4 (S40). Note that the amorphous semiconductor film 5a can also be formed by plasma CVD or the like.

Subsequently, dehydrogenation processing is performed as a preliminary preparation for crystallizing the amorphous semiconductor film 5a. For a specific example, annealing is performed at 400° C. to 500° C. for 30 minutes.

Next, as shown in (f) in FIG. 5, a crystalline semiconductor film is formed by irradiating the amorphous semiconductor film 5a with a predetermined laser beam so as to crystallize the amorphous semiconductor film 5a (S50).

Figure 6A:
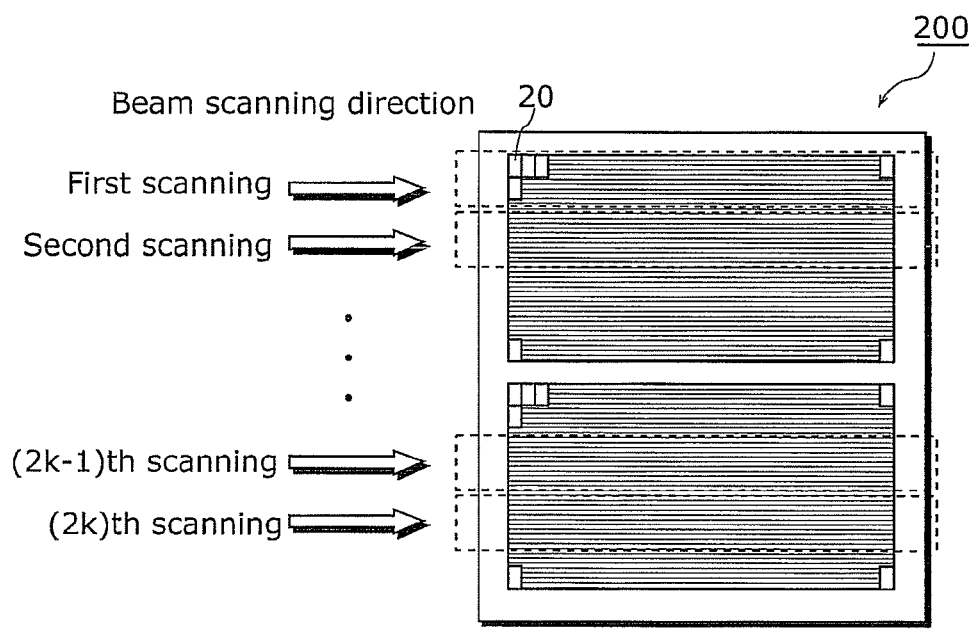
FIG. 6A is a diagram showing a laser beam scanning method in a laser annealing method according to the first embodiment of the present invention.
Figure 6B:
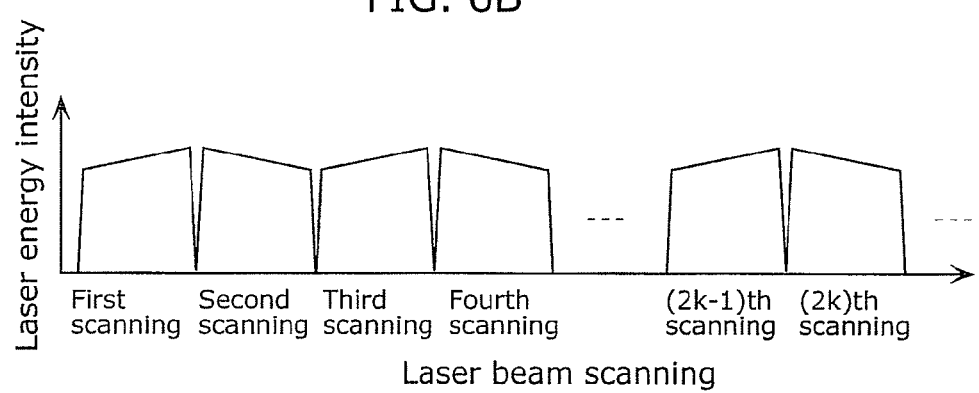
FIG. 6B is a diagram showing a laser beam scanning method in the laser annealing method according to the first embodiment of the present invention.
Figure 7:
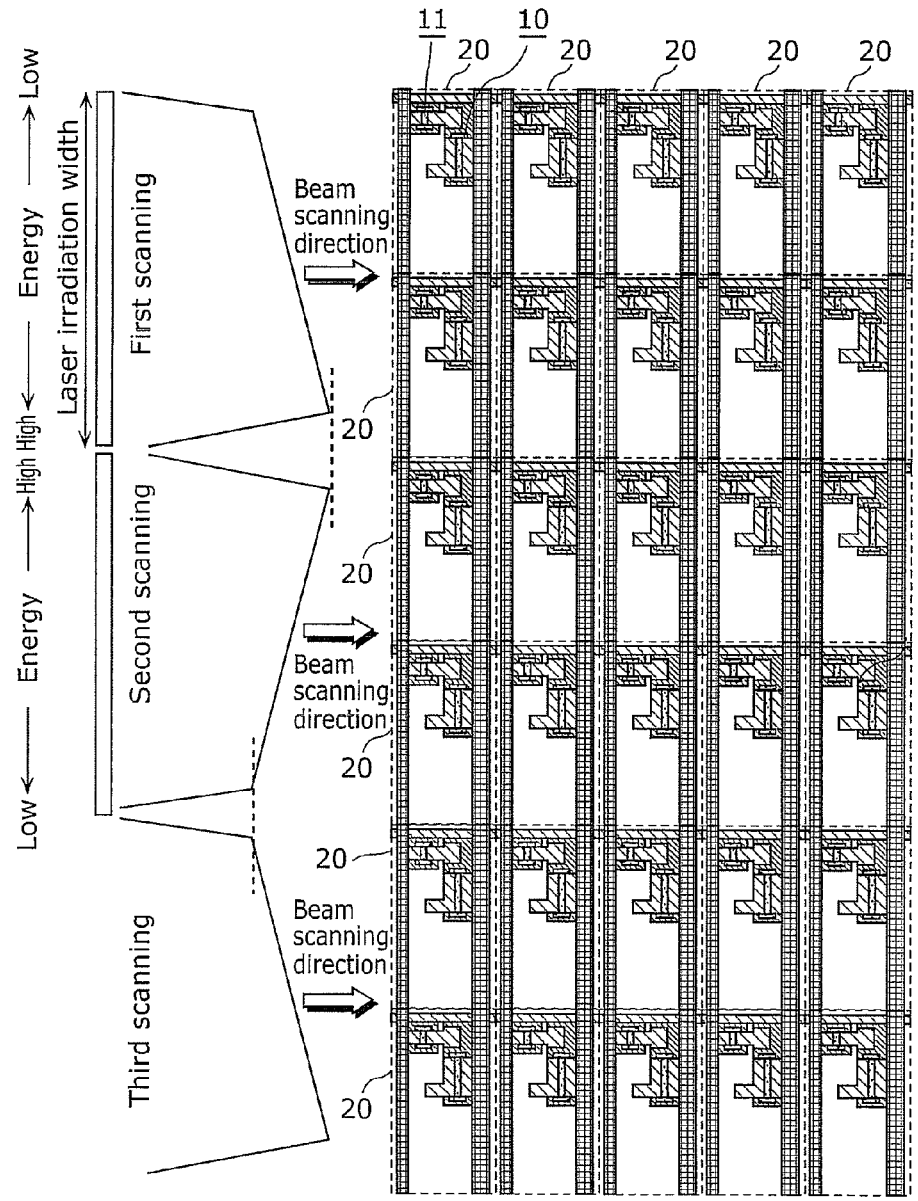
FIG. 7 is a diagram showing details of a relationship between a light intensity distribution of the laser beam and pixels in beam scanning by the laser annealing method according to the first embodiment of the present invention.

Here, details of the crystallization of the amorphous semiconductor film in the present embodiment are described with reference to FIGS. 6A, 6B, and 7. FIGS. 6A and 6B are diagrams showing a beam scanning method in the crystallization method (laser annealing method) for crystallizing the amorphous semiconductor according to the present embodiment. FIG. 7 is a diagram showing details of a relationship between a light intensity distribution of the laser beam and pixels in the beam scanning by the laser annealing method according to the present embodiment.

Figure 15:
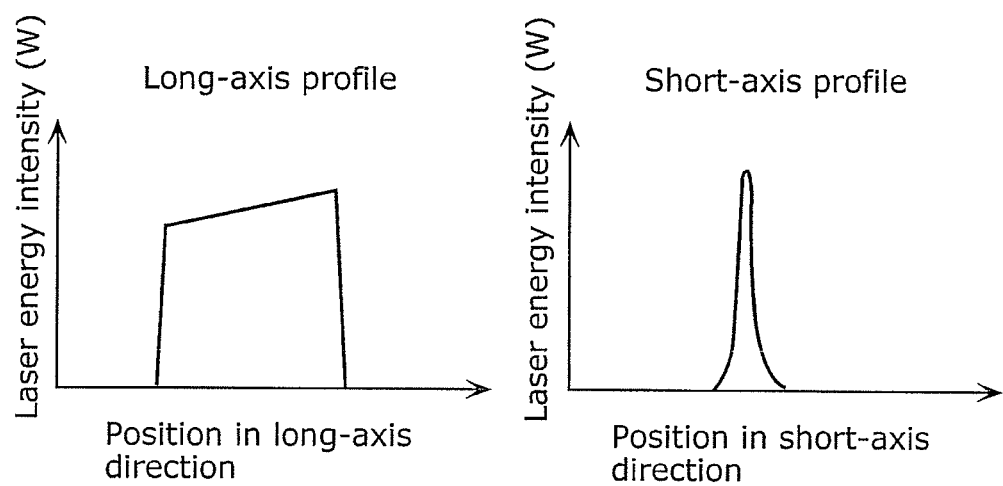
FIG. 15 is a diagram showing a long-axis profile and a short-axis profile of a laser beam in a conventional laser annealing method.
Figure 16A:
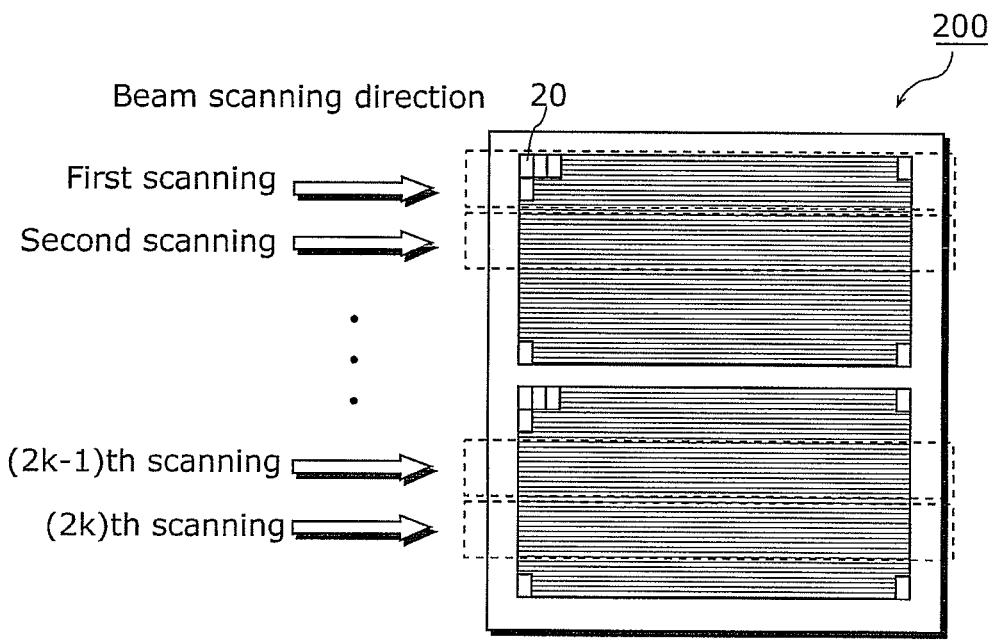
FIG. 16A is a beam scanning method in the conventional laser annealing method.
Figure 16B:
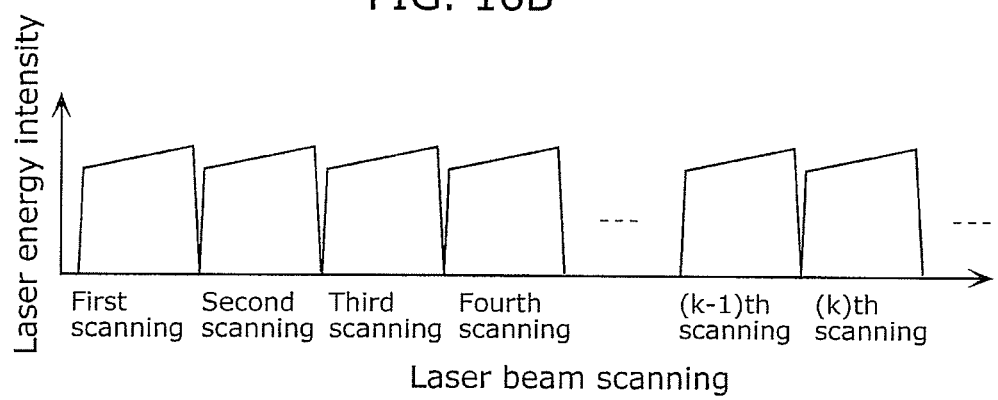
FIG. 16B is a beam scanning method in the conventional laser annealing method.
Figure 17:
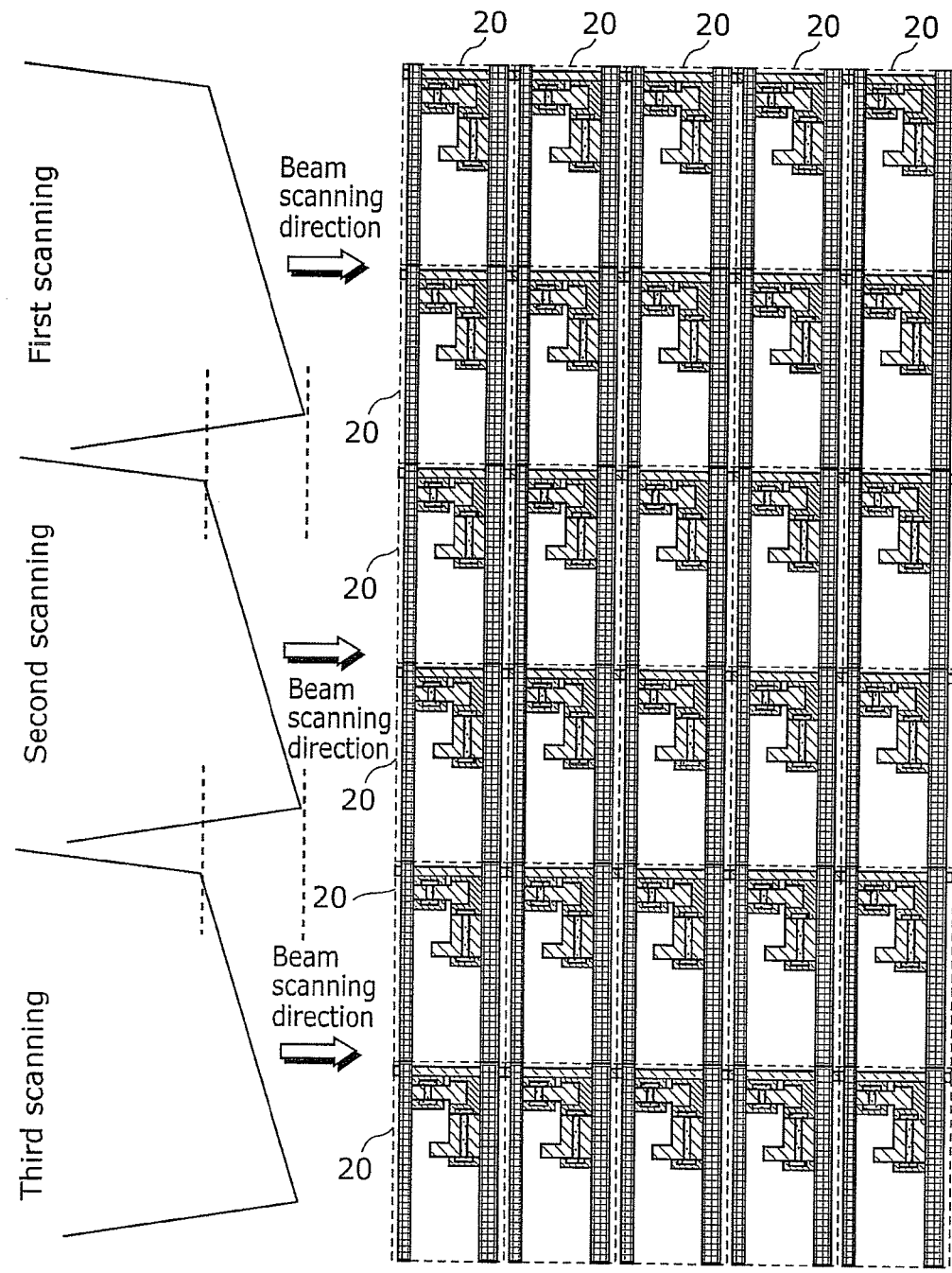
FIG. 17 is a diagram showing details of a relationship between a light intensity distribution of the laser beam and pixels in beam scanning in the conventional laser annealing method according to the second embodiment of the present invention.

For the laser beam according to the present embodiment, as conventionally, it is possible to use a laser beam having the light intensity distribution shown in FIG. 15. More specifically, the laser beam in the present embodiment has a light intensity distribution having a flat-topped laser energy intensity in the long axis, and a light intensity distribution having a Gaussian laser energy intensity in the short axis.

The laser annealing method according to the present embodiment, as shown in FIGS. 6A and 6B, is a method of irradiating, with a laser beam having the light intensity distribution as described above, the amorphous semiconductor film formed above the TFT array substrate 200 in which the pixels 20 are arranged in a matrix.

In this processing, the laser irradiation is performed such that the column direction of the pixels coincides with the long-axis direction of the light intensity distribution of the laser beam. In addition, the laser irradiation is repeatedly performed per unit of a block made up of a plurality of rows of pixels 20 such that a laser irradiation width of the laser beam in one block is n times (where n is an integer of 2 or more) a width (a length in the column direction) of the pixels 20. In the present embodiment, as shown in FIGS. 6A and 7, a pair of two rows (2 lines) constitutes one block. Note that the laser irradiation width is a length in the long-axis direction (in the column direction of the pixels) of the laser beam for irradiating the amorphous semiconductor film.

In addition, in the top portion of the light intensity distribution of the laser beam, the laser energy intensity is higher in one end portion than in the other end portion.

Then, in the present embodiment, the configuration is such that the laser energy intensity of the laser beam is inverted in increments of n pixels (per block), alternately between the one end portion of the laser irradiation width and the other end portion of the laser irradiation width. In other words, the configuration is such that the light intensity distribution of the laser beam is inverted for each block.

Thus, when sequentially scanning each block with a laser beam starting from the top, in order of the first scanning, the second scanning, the (2k−1)th scanning, and the (2k)th scanning, odd-numbered blocks in the first, the third, and the (2k−1)th scanning are irradiated with a laser beam according to the light intensity distribution that is not inverted (normal light intensity distribution), and even-numbered blocks in the second, the fourth, and the (2k)th scanning are irradiated with a laser beam according to the light intensity distribution that is inverted.

Note that FIG. 7 shows, for each pixel 20, two TFTs that are the driving TFT 10 and the switching TFT 11, but when the laser irradiation described above is performed, the source and drain electrodes of the driving TFT 10 and the switching TFT 11 are not formed yet, and the amorphous semiconductor film is formed in the top face.

As described above, in the present embodiment, laser beam scanning is performed inverting, alternately for each block, the light intensity distribution of the laser beam.

This allows, as shown in (f) in FIG. 5, crystallizing the amorphous semiconductor film 5a to form into a crystalline semiconductor film 5p including a polycrystalline structure. Subsequently, the hydrogen termination processing is performed on the crystalline semiconductor film 5p by performing hydrogen plasma treatment using $SiH_4/H_2$.

Next, as shown in (g) in FIG. 5, the amorphous semiconductor film 6a having a film thickness of approximately 100 nm is formed on the crystalline semiconductor film 5p. Specifically, by the plasma CVD method, an amorphous semiconductor film 6a is formed as an amorphous silicon film.

Next, as shown in (h) in FIG. 5, the crystalline semiconductor film 5p and the amorphous semiconductor film 6a are formed in an island state by selectively patterning, by photolithography and wet etching, the crystalline semiconductor film 5p and the amorphous semiconductor film 6a that are stacked. With this, a channel portion in which the crystalline semiconductor film 5 and the amorphous semiconductor film 6 are stacked is formed.

Next, as shown in (i) in FIG. 5, an impurity-doped amorphous semiconductor film 7a that is to be the contact layer 7 is formed by: forming an amorphous semiconductor film as an amorphous silicon film by the plasma CVD or the like, and doping the amorphous semiconductor film with an impurity. For the impurity, for example, a quinquevalent element such as phosphorous can be used. In addition, doping is performed such that the impurity concentration is at a high level.

Next, as shown in (j) in FIG. 5, patterning is performed on the impurity-doped amorphous semiconductor film 7a by performing photolithography and wet etching on the impurity-doped amorphous semiconductor film 7a such that the impurity-doped amorphous semiconductor film 7a covers the top and lateral faces of the amorphous semiconductor film 6 and the lateral face of the crystalline semiconductor film 5.

Next, as shown in (k) in FIG. 5, a source-drain metal layer 8M is formed on the impurity-doped amorphous semiconductor film 7a. The source-drain metal layer 8M is made of a material used for forming the source electrode 8 and the drain electrode 9. In the present embodiment, the source-drain metal layer 8M having a trilayer structure of MoW/Al/MoW is formed by the sputtering method.

Next, as shown in (l) in FIG. 5, the source electrode 8 and the drain electrode 9 are formed by patterning the source-drain metal layer 8M by performing photolithography and wet etching on the source-drain metal layer 8M.

Subsequently, with a resist (shown) for patterning the source-drain metal layer 8M unremoved, as shown in (m) in FIG. 5, dry etching is performed to etch the impurity-doped amorphous semiconductor film 7a that is exposed, as well as etching part of a top portion of the amorphous semiconductor film 6. Thus, by separating the impurity-doped amorphous semiconductor film 7a, it is possible to form a pair of first contact layers 7 that are $n^+$ layers. In addition, by etching the top layer of the amorphous semiconductor film 7a, it is possible to form the channel portion of a desired film thickness.

With this, it is possible to manufacture the thin-film transistor device according to the first embodiment of the present invention.

As described above, with the crystalline semiconductor film manufacturing method according to the first embodiment of the present invention, when forming a crystalline semiconductor film by crystallizing an amorphous semiconductor film, laser irradiation is performed per unit of a block made up of n pixels (in increments of n pixels), using a laser beam having an irradiation width corresponding to n times the number of pixels. In this processing, the laser irradiation is performed such that the energy intensity of the laser beam is inverted for each block (in increments of n pixels), alternately between one and the other end portions of the laser irradiation width.

With this, as shown in FIG. 7, it is possible to equalize the intensity of the laser energy projected onto pixels in the bottom line of one block and the intensity of the laser energy projected onto pixels in the top line of the block next to the one block.

As a result, irradiated with a laser beam at almost equal laser energy intensity, the crystalline semiconductor film is formed on the gate electrode in a pixel in the bottom line included in one block, and the crystalline semiconductor film is formed on the gate electrode in a pixel in the top line included in the next block.

Thus, it is possible to form, in almost the same grain size, the crystalline semiconductor film in the bottom line of the one block and the crystalline semiconductor film in the top line of the next block.

With this, the energy intensity is serially smooth when the energy intensity distribution of the laser beam to be projected onto the entire amorphous semiconductor film is viewed in the column direction of the pixels. This accordingly allows suppressing variation of TFT characteristics in the entire substrate.

As described above, in the present embodiment, this allows preventing TFT characteristics from varying depending on a position of a boundary (block boundary position) between laser irradiation widths of the laser beam, thus allowing preventing a phenomenon such as a stripe or line appearing along the laser irradiation width of the laser beam when viewed as the entire display apparatus. Thus, it is possible to realize a display device having high-quality image display performance.

Figure 8A:
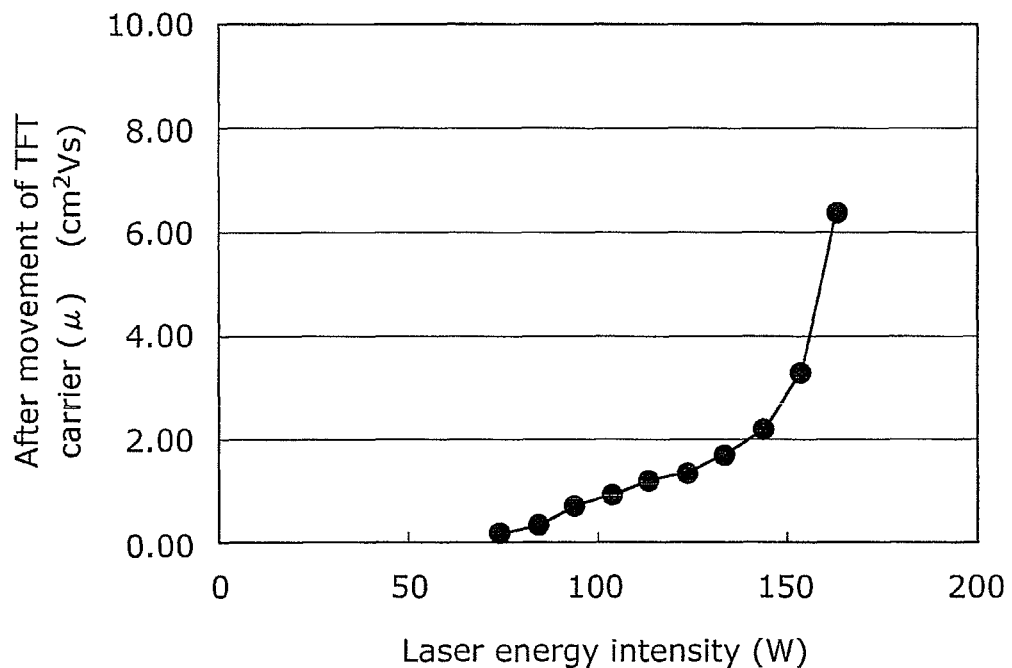
FIG. 8A is a diagram showing a relationship between laser energy intensity and carrier mobility of a TFT in the crystalline semiconductor film manufacturing method according to the first embodiment of the present invention.

Note that in the present embodiment, the grain size of the crystalline semiconductor film formed by the laser irradiation is increased by increasing an output level of the laser energy intensity of the laser beam for irradiating the amorphous semiconductor film. Accordingly, in the TFT including this crystalline semiconductor film as the channel layer, as shown in FIG. 8A, it is also possible to increase carrier mobility in the TFT by increasing the output level of the laser energy intensity of the laser beam.

Figure 8B:
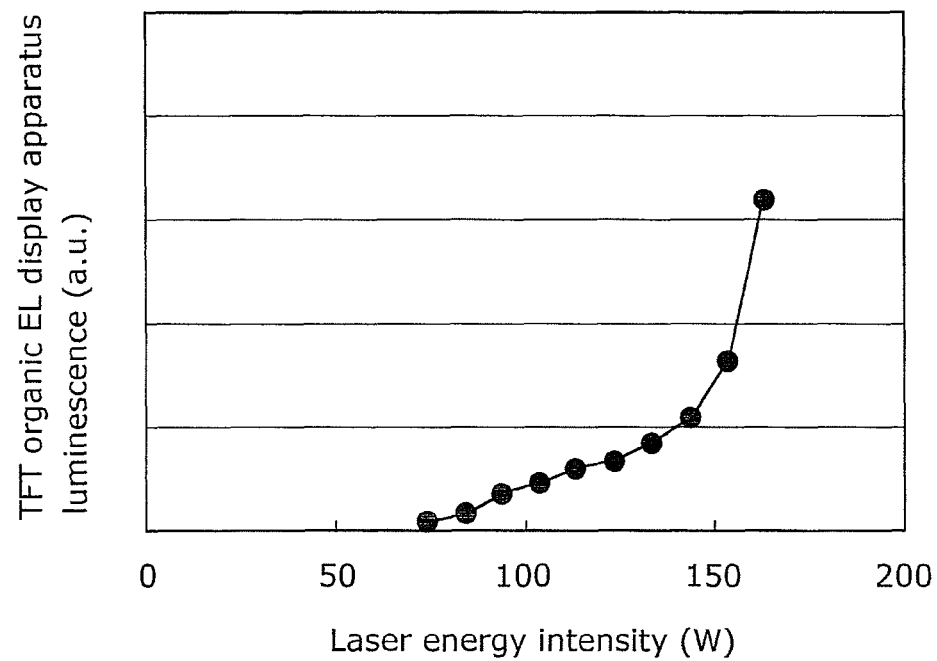
FIG. 8B is a diagram showing laser energy intensity and luminescence brightness of an organic EL display device in the crystalline semiconductor film manufacturing method according to the first embodiment of the present invention.

Thus, in the case of using the TFT according to the present embodiment as the driving TFT in the pixel circuit of the organic EL display apparatus, it is also possible to increase luminescence brightness of the organic EL display apparatus as shown in FIG. 8B.

In addition, in the crystalline semiconductor film forming process (S50) in the present embodiment, it is preferable that the amorphous semiconductor film be irradiated with the laser beam at a constant scanning speed within a region in which the amorphous semiconductor film is to be formed across the entire substrate.

This allows irradiating the amorphous semiconductor film with a laser beam at constant laser energy intensity per unit time, thus achieving a constant temperature rise in the amorphous semiconductor film which is caused by the laser irradiation. Thus, this allows further equalizing the grain size of the crystalline semiconductor film in the entire substrate, and thus allows further suppressing variation in TFT characteristics in the entire substrate.

In addition, in the crystalline semiconductor film forming process (S50) in the present embodiment, laser irradiation is repeatedly performed per unit of a block made up of rows of pixels 20, but it is preferable that the laser scanning in this process be performed according to a laser beam width (laser irradiation width) and the number of scans that are determined in consideration of the number of pixels and panel dimensions of the display panel. In other words, for performing laser irradiation, it is preferable to adjust the beam width and the number of scans according to the type of the display panel.

Figure 9A:
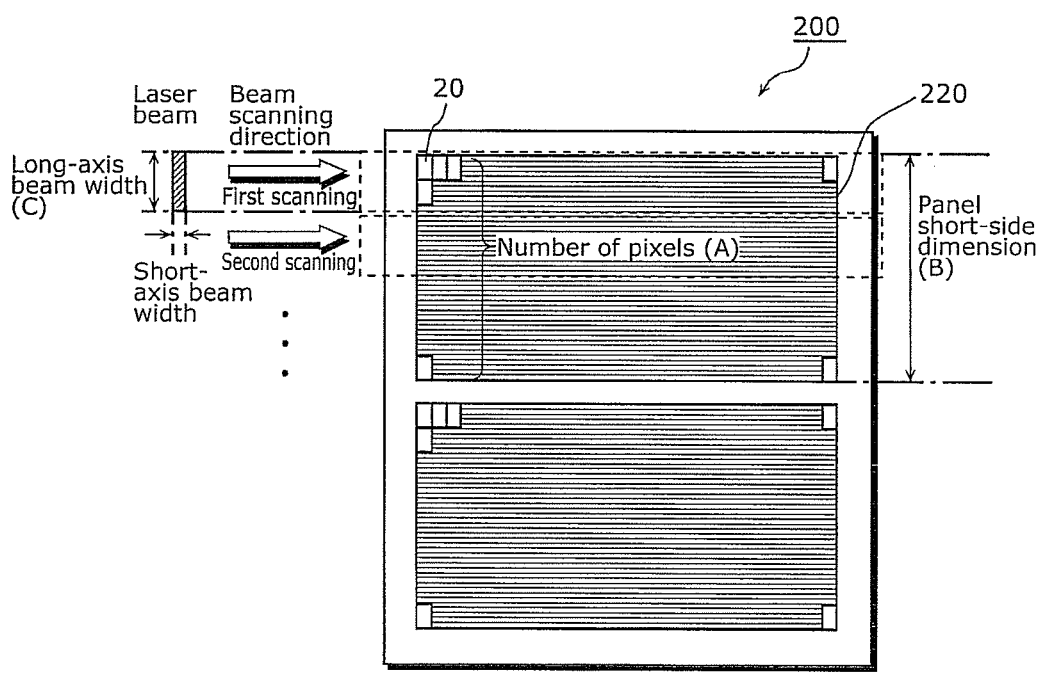
FIG. 9A is a diagram for describing a relationship between the number of pixels and panel dimensions of the display panel and a laser beam width, in laser scanning in the first embodiment of the present invention.

The following describes this point with reference to FIGS. 9A and 9B. FIG. 9A is a diagram for describing a relationship between the number of pixels and panel dimensions of the display panel and the laser beam width, in the laser scanning in the first embodiment of the present invention. FIG. 9B is a diagram for describing: a relationship between resolution and the number of pixels of the display panel; a relationship between a panel size and a long side dimension or a short side dimension of the display panel; and a relationship between a laser method and a maximum laser beam width.

Whether it is possible or not to scan one display panel with one laser scan shot depends upon a size relationship between a short side dimension (B) of the display panel and a beam width (C). For example, with reference to FIG. 9B, when excimer laser is used for the laser method, it is possible to scan a display panel of a panel size up to 58 inches with one scan shot, but a panel size over 58 inches needs scanning more than one time. In addition, when a solid-state continuous wave (CW) laser is used for the laser method, a display panel of at least 42 inches or over needs scanning more than one time.

Here, although the number of scans is generally determined by B/C (B divided by C), the laser irradiation to be performed in the present embodiment requires positioning a laser beam edge between pixels; thus, as shown in (Expression 1) below, it is necessary to adjust the laser width (C) to a dimension of one pixel (a length in a display-panel short side direction of one pixel), that is, to an integral multiple of (B/A). Note that in (Expression 1), n is an integer and represents the number of pixels to be irradiated with a laser beam with one scan shot.

$$C = n \times (B/A) \quad \text{(Expression 1)}$$

Furthermore, to crystallize the display unit 220 (display region) in the display panel more efficiently, it is preferable to match starting and end positions for the laser scanning to positions of the upper and lower end portions in a short side direction of the display panel. More specifically, it is preferable that, as shown in (Expression 2) below, the short side dimension (B) of the display panel is an integral multiple of the beam width (C). Note that in (Expression 2), m is an integer and represents the number of scans.

$$B = m \times C \quad \text{(Expression 2)}$$

Accordingly, it is preferable to select the scanning method that satisfies $n \times m = A$ according to (Expression 1) and (Expression 2).

For example, where the resolution is high definition (HD), full high definition (FHD), or 4k2k, the following result is obtained by factorizing the number of pixels in the short side direction into prime factors:

(HD) $768 = 2^8 \times 3$ (FHD) $1080 = 2^3 \times 3^3 \times 5$ (4k2k) $2160 = 2^4 \times 3^3 \times 5$ In each case, there are a multiple number of combinations of the divisors, but the most efficient scanning method is to select a combination that maximizes n. Then, using n in this case, it is possible to determine the desired laser width (C) and the number of scans (m). The three specific examples are described below.

As a first specific example, the case of irradiating a 42-inch FHD display panel with a solid-state CW laser is considered. In this case, with reference to FIG. 9B, the number of pixels in the short side (A) is 1080, the short side dimension (B) of the display panel is 524 mm, and the maximum beam width (C) is 5 mm.

In this case, the dimension of one pixel (a length in a display-panel short side direction of one pixel) is: 524 mm/1080≈0.485 mm. In addition, the maximum number of pixels that can be irradiated in one scan shot is: 5/0.485≈10.3. Up to this 10.3, the largest divisor of 1080 is 10; thus, n=10. As a result, the most efficient scanning method is performed with the number of scans m set to: m=A/n=1080/10=108.

Accordingly, in the laser irradiation in the first specific example, it is preferable to perform 108 scans in increments of 10 pixels, with the laser width (C) adjusted to C=B/m 524/108≈4.85 mm. Note that the laser width can be adjusted by cutting both ends of the laser beam in the long axis direction using an optical component such as a beam splitter.

Next, as a second specific example, the case of irradiating a 58-inch 4k2k display panel with a solid-state CW laser is considered. In this case, with reference to FIG. 9B, the number of short side pixels (A) is 2160, the short side dimension (B) of the display panel is 723 mm, and the maximum beam width (C) is 5 mm.

In this case, the dimension of one pixel (a length in a display-panel short side direction of one pixel) is: 723 mm/2160≈0.335 mm. In addition, the maximum number of pixels that can be irradiated in one scan shot is: 5/0.335≈14.9. Up to this 10.9, the largest divisor of 2160 is 12; thus, n=12. According to this result, the most efficient scanning method is performed with the number of scans m set to: m=A/n=2160/12=180.

Accordingly, in the laser irradiation in the second specific example, it is preferable to perform 180 scans in increments of 12 pixels, with the laser width (C) adjusted to C=B/m 723/180≈4.02 mm.

Next, as a third specific example, the case of irradiating a 58-inch 4k2k display panel with a pulsed solid state laser is considered. In this case, with reference to FIG. 9B, the number of short side pixels (A) is 2160, the short side dimension (B) of the display panel is 723 mm, and the maximum beam width (C) is 300 mm.

In this case, the dimension of one pixel (a length in a display-panel short side direction in one pixel) is: 723 mm/2160≈0.335 mm. In addition, the maximum number of pixels that can be irradiated in one scan shot is: 300/0.335≈89535. Up to this 895.5, the largest divisor of 2160 is 720; thus, n=720. According to this result, the most efficient scanning method is performed with the number of scans m set to: m=A/n=2160/720=3.

Accordingly, in the laser irradiation in the first specific example, it is preferable to perform 3 scans in increments of 720 pixels, with the laser width (C) adjusted to C=B/m 723/3=241 mm.

As described above, in the laser irradiation for crystallizing the amorphous semiconductor film, it is preferable to adjust the beam width and the number of scans according to the type of the display panel.

Note that as described above, it is preferable to perform laser irradiation on the condition that m is an integer, but it is also possible to perform laser irradiation on a condition that m is not an integer. For example, it is possible to perform laser irradiation on the condition that m is not an integer, by adjusting the beam width only for the final scan, or spreading the laser irradiation region outside the display unit or the display panel.

In addition, the three specific examples have been described above for the laser scanning method, but the laser scanning method is not limited to these examples. Furthermore, FIG. 9B shows each relationship as a mere example, and another resolution, another panel size, and another laser method may be used. For example, the panel size may be smaller than 42 inches or larger than 65 inches.

(Crystalline Semiconductor Film Manufacturing Apparatus)

Figure 10:
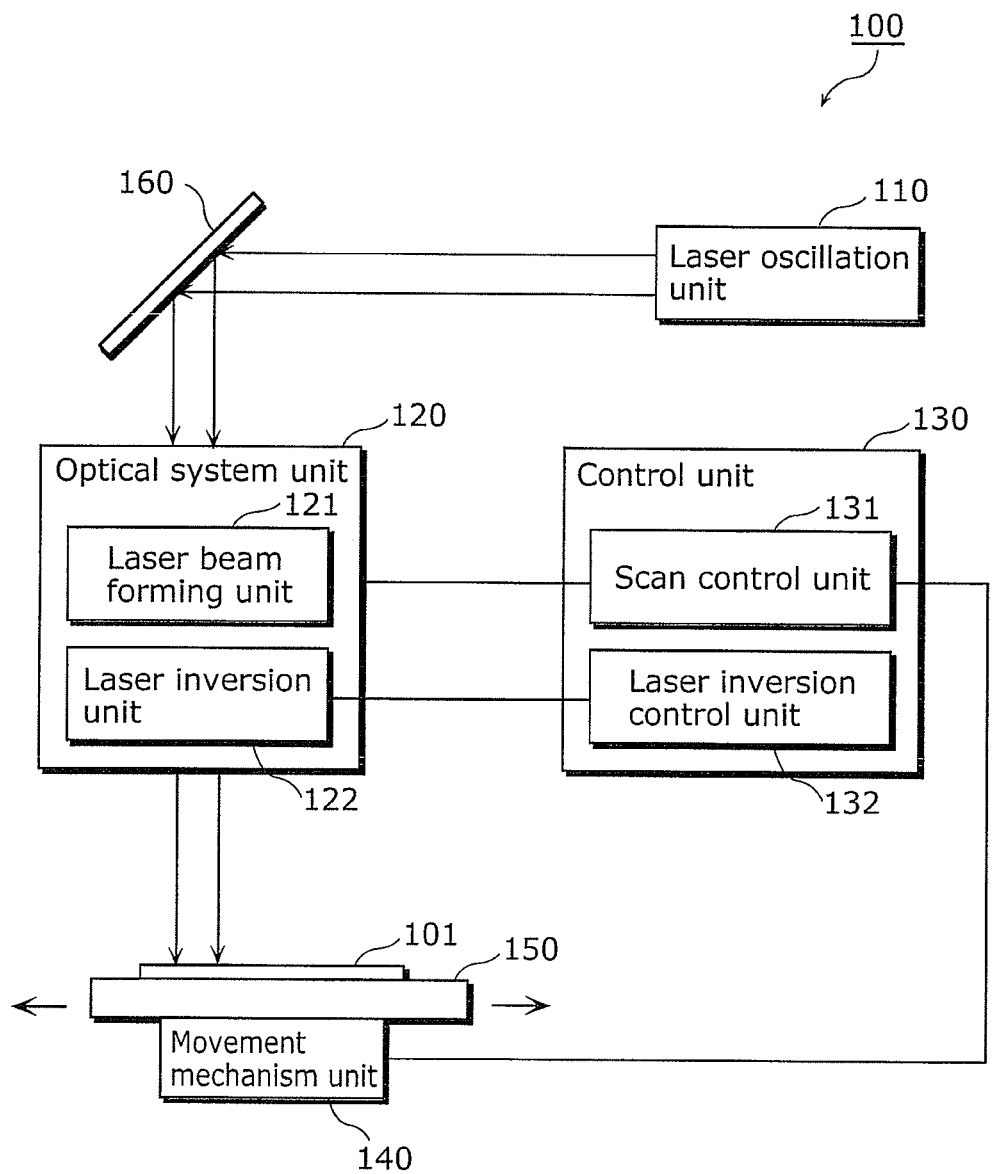
FIG. 10 is a block diagram schematically showing a crystalline semiconductor film manufacturing apparatus according to the first embodiment of the present invention.

Next, the crystalline semiconductor film manufacturing method according to the first embodiment of the present invention will be described with reference to FIG. 10. FIG. 10 is a block diagram schematically showing the crystalline semiconductor film manufacturing apparatus according to the first embodiment of the present invention.

As shown in FIG. 10, the crystalline semiconductor film manufacturing apparatus 100 according to the first embodiment of the present invention is an apparatus for crystallizing the amorphous semiconductor film described above by leaser annealing, and includes: a laser oscillation unit 110, an optical system unit 120, a control unit 130, and a movement mechanism unit 140, a substrate holding unit 150, and a mirror 160.

The laser oscillation unit 110 is a laser oscillation device which oscillates a predetermined laser beam for crystallizing the amorphous semiconductor film formed above the substrate. Note that for the laser beam to be oscillated, any one of the laser beams, that is, a continuous oscillation laser beam and a pulse laser beam may be used.

The optical system unit 120 includes a predetermined optical component such as a lens for irradiating, at a predetermined laser irradiation width, a predetermined region of the amorphous semiconductor film with the predetermined laser beam oscillated from the laser oscillation unit 110. In the present embodiment, the optical system 120 includes a laser beam forming unit 121 and a laser inversion unit 122.

The laser beam forming unit 121 forms a laser beam such that the laser beam oscillated from the laser oscillation unit 110 and reflected by the mirror 160 has a predetermined light intensity distribution. In the present embodiment, as shown in FIG. 15 above, the laser beam forming unit 121 forms a laser beam having a flat-topped laser energy intensity in the long axis and a Gaussian laser energy intensity in the short axis.

Figure 11:
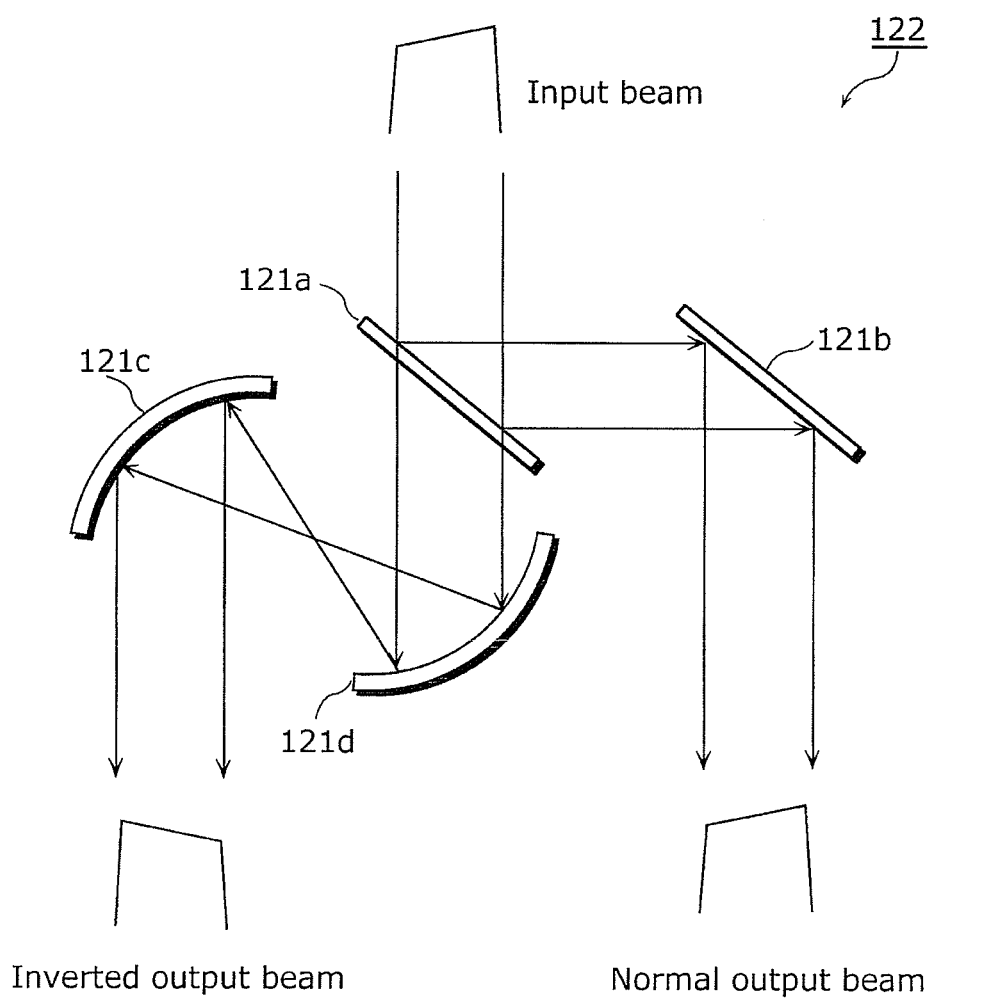
FIG. 11 is a block diagram schematically showing a configuration of a laser inversion unit in the semiconductor film manufacturing apparatus according to the first embodiment of the present invention.

The laser inversion unit 122 has a function to perform a normal output or an inverted output of the laser beam and includes a predetermined optical part. FIG. 11 is a block diagram schematically showing a configuration of the laser inversion unit 122 in the semiconductor film manufacturing apparatus according to the present embodiment. As shown in FIG. 11, the laser inversion unit 122 in the present embodiment includes a switching mirror 122a, a reflection mirror 122b, a first inversion mirror 122c, and a second inversion mirror 122d. The laser inversion unit 122, when performing normal output of the input laser beam, causes the input beam to enter the reflection mirror 122b through the switching mirror 122a, and outputs the laser beam such that the light intensity distribution of the output beam is the same as the light intensity distribution of the input beam. In addition, when performing inverted output of the input laser beam, the laser inversion unit 122 causes the input beam to enter the first inversion mirror 122c through the switching mirror 122a, and outputs the laser beam such that the light intensity distribution of the output beam is horizontally inverted using the first inversion mirror 122c and the second inversion mirror 122d.

Again, back to FIG. 10, the control unit 130 includes a scan control unit 131 and a laser inversion control unit 132.

The scan control unit 131 outputs a control signal for controlling a position of the substrate holding unit 150 or the optical system unit 120 such that the laser beam is projected onto the substrate in a relation relative to each other.

In addition, the laser inversion control unit 132 outputs, to the laser inversion unit 122, an inversion control signal for inverting the laser energy intensity of the laser beam. The laser inversion unit 122 is controlled by the control signal from the laser inversion control unit 132, so that the laser energy intensity is inverted in increments of n pixels, that is, for each block made up of a plurality of pixel rows, alternately between one end and the other end of the irradiation width of the laser beam. In other words, in increments of n pixels, the light intensity distribution of the laser beam is alternated between normal output and inverted output.

The movement mechanism unit 140 moves the substrate holding unit 150 such that the laser beam is projected onto the substrate in a relation relative to each other, in response to the control signal from the scan control unit 131.

The substrate holding unit 150 holds the substrate 101 above which the amorphous semiconductor film that is to be irradiated with the laser beam is formed.

As described above, the crystalline semiconductor film manufacturing apparatus 100 according to the first embodiment of the present invention includes the laser inversion unit 122 and the laser inversion control unit 132 described above such that the laser energy intensity is inverted in increments of n pixels, alternately between one end portion and the other end portion of the laser irradiation width.

Thus, it is possible to perform inversion control of the laser beam as shown in FIGS. 6A and 6B, and thereby to allow, as shown in FIG. 7, equalizing the intensity of the laser energy projected onto pixels in a bottom line of one block and the intensity of the laser energy projected onto pixels in a top line of a block next to the one block.

As a result, the crystalline semiconductor film formed on the gate electrode in a pixel in the bottom line of the one block and the crystalline semiconductor film formed on the gate electrode in a pixel in the top line of the next block are formed by laser irradiation at almost equal laser energy intensity.

Thus, by performing laser irradiation using the crystalline semiconductor film manufacturing apparatus 100 according to the first embodiment, it is possible to form, in almost the same grain size, the crystalline semiconductor film in the bottom line of the one block and the crystalline semiconductor film in the top line of the next block.

First Variation of First Embodiment

Figure 12:
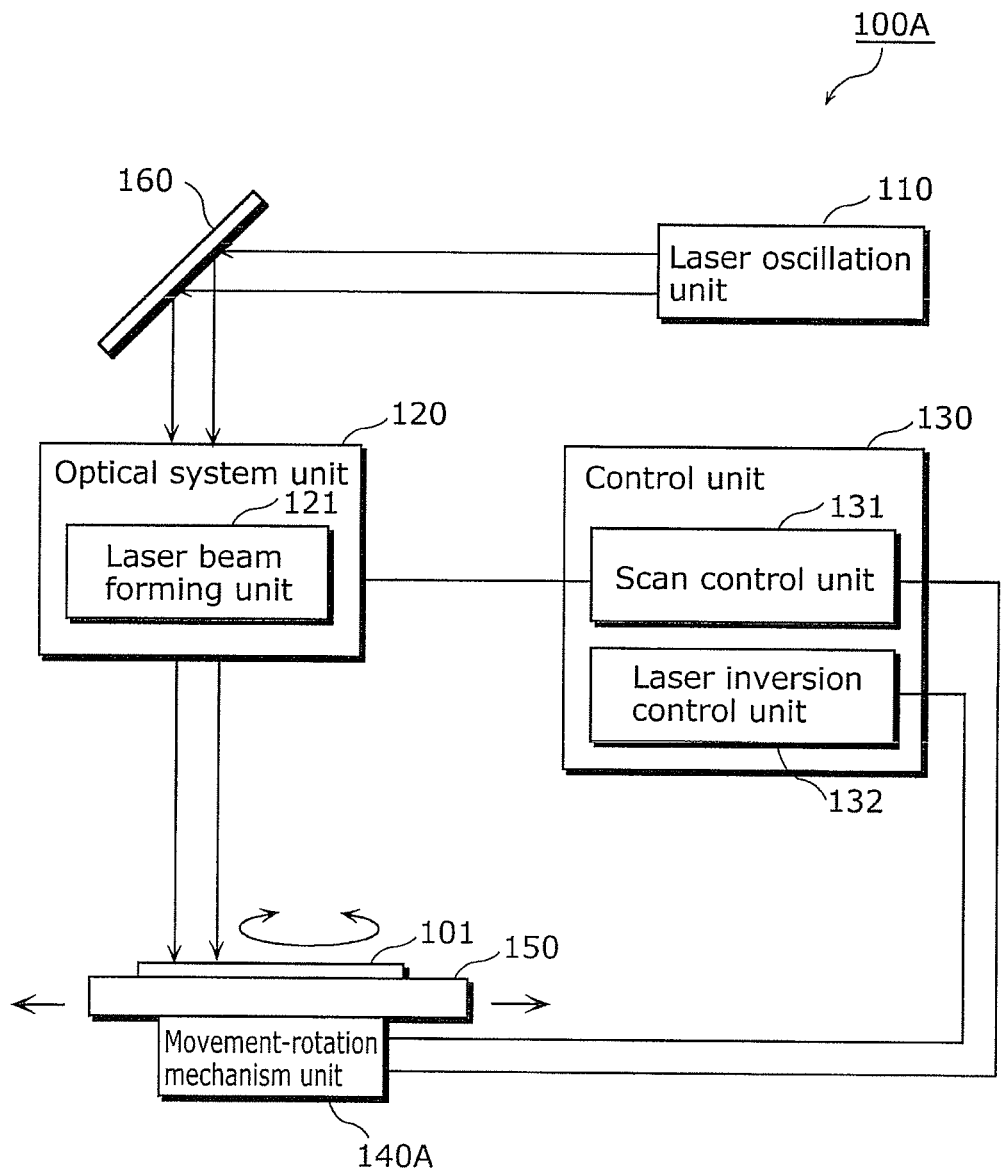
FIG. 12 is a block diagram schematically showing a crystalline semiconductor film manufacturing apparatus according to a first variation of the first embodiment of the present invention.

Next, the crystalline semiconductor film manufacturing method according to a first variation of the first embodiment of the present invention will be described with reference to FIG. 12. FIG. 12 is a block diagram schematically showing the crystalline semiconductor film manufacturing apparatus according to the first variation of the first embodiment of the present invention. Note that in FIG. 12, the same constituent elements as those of the crystalline semiconductor film manufacturing apparatus 100 according to the first embodiment of the present invention as shown in FIG. 10 are assigned with the same numerical references, and the descriptions thereof are omitted.

The crystalline semiconductor film manufacturing apparatus 100A according to the present variation as shown in FIG. 12 is different from the crystalline semiconductor film manufacturing apparatus 100 according to the first embodiment of the present invention as shown in FIG. 10 in that the crystalline semiconductor film manufacturing apparatus 100A according to the first variation includes a movement-rotation mechanism unit 140A in place of the movement mechanism unit 140 shown in FIG. 10.

As shown in FIG. 12, the crystalline semiconductor film manufacturing apparatus 100A according to the first variation includes the movement-rotation mechanism unit 140A.

The movement-rotation mechanism unit 140A has a function to rotate the substrate holding unit 150 in addition to the function of the movement mechanism unit 140 shown in FIG. 10. In other words, the movement-rotation mechanism unit 140A, in response to the control signal from the scan control unit 131, can move the substrate holding unit 150 so that the laser beam is projected onto the substrate 101 in a relation relative to each other, and can also perform inversion control to rotate the substrate holding unit 150 180 degrees in response to the inversion control signal from the laser inversion control unit 132.

With this, as with the crystalline semiconductor film manufacturing apparatus 100 according to the first embodiment, it is possible to perform inversion control of the laser beam as shown in FIGS. 6A and 6B, and thereby, as shown in FIG. 7, it is possible to equalize the intensity of the laser energy projected onto pixels in the bottom line of one block and the intensity of the laser energy projected onto pixels in a top line of a block next to the block.

In other words, this first variation involves performing inversion control of the light intensity distribution of the laser beam by half-rotating the substrate 101 in increments of n pixels, instead of inverting the light intensity distribution of the laser beam through the optical system unit 120.

As a result, as with the first embodiment, the crystalline semiconductor film formed on the gate electrode in a pixel in the bottom line of one block and the crystalline semiconductor film formed on the gate electrode in a pixel in the top line of the next block are formed by laser irradiation at almost equal laser energy intensity.

Thus, by performing laser irradiation using the crystalline semiconductor film manufacturing apparatus 100A according to the first variation, it is also possible to form, in almost the same grain size, the crystalline semiconductor film in the bottom line of the one block and the crystalline semiconductor film in the top line of the next block. This allows preventing the TFT characteristics from varying depending on the position of the boundary between laser irradiation widths of the laser beam.

Second Variation of First Embodiment

Figure 13A:
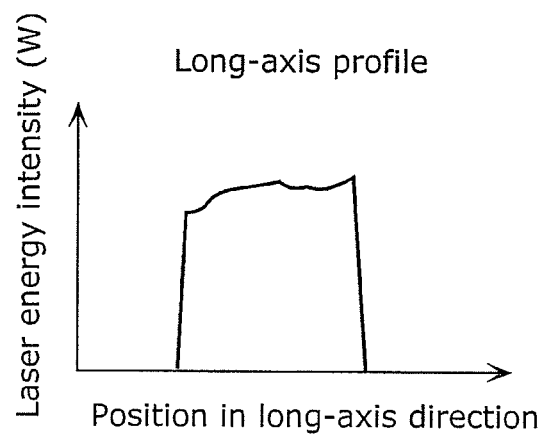
FIG. 13A is a diagram showing a long-axis profile of a laser beam in a crystalline semiconductor film manufacturing method according to a second variation of the first embodiment of the present invention.
Figure 13B:
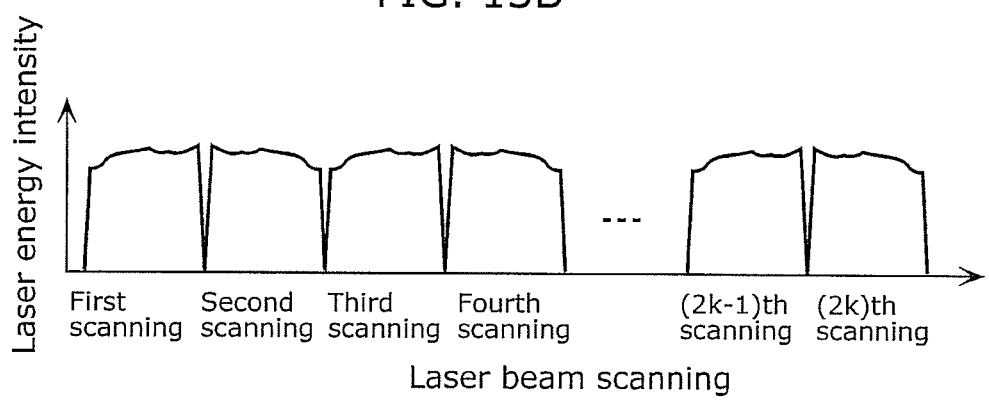
FIG. 13B is a diagram showing a beam scanning method for laser irradiation in a crystalline semiconductor film manufacturing method according to the second variation of the first embodiment of the present invention.

Next, the crystalline semiconductor film manufacturing method according to a second variation of the first embodiment of the present invention will be described with reference to FIGS. 13A and 13B. FIG. 13A is a diagram showing a long-axis profile of a laser beam in the crystalline semiconductor film manufacturing method according to the second variation of the first embodiment of the present invention. FIG. 13B is a diagram showing a beam scanning method in the laser irradiation according to the second variation.

Note that the crystalline semiconductor film manufacturing method according to the second variation is basically the same as the crystalline semiconductor film manufacturing method according to the first embodiment of the present invention, and is different only in terms of the light intensity distribution of the laser beam for crystallizing the amorphous semiconductor film.

The light intensity distribution of the laser beam in the crystalline semiconductor film manufacturing method according to the second variation, as shown in FIG. 13A, has a flat-topped laser energy intensity in the long axis as with the first embodiment; however, compared to FIG. 15, the laser energy intensity at both end portions of the top portion of the light intensity distribution varies in an irregular pattern. However, the laser energy intensity at one of the end portions in the top portion is higher than the laser energy intensity at the other of the end portions. Note that in the short axis, the light intensity distribution of the laser beam has a Gaussian laser energy intensity as in FIG. 15.

In addition, as shown in FIG. 13B, in the laser scanning method for crystallizing the amorphous semiconductor film, as with the first embodiment, laser irradiation is performed such that the laser energy intensity is inverted in increments of n pixels, that is, per block made up of a plurality of pixel rows, alternately between one end portion and the other end portion of the laser irradiation width. In other words, the configuration is such that the light intensity distribution of the laser beam is alternately inverted for each block.

Thus, when sequentially scanning each block with a laser beam starting from the top, in order of the first scanning, the second scanning, the (2k−1)th scanning, and the (2k)th scanning, laser irradiation is performed on odd-numbered blocks in the first, the third, and the (2k−1)th scanning according to the light intensity distribution that is not inverted, and laser irradiation is performed on even-numbered blocks in the second, the fourth, and the (2k)th scanning according to the light intensity distribution that is inverted.

Thus, as shown in FIG. 13B, with the crystalline semiconductor film manufacturing method according to the second variation, it is also possible to equalize the intensity of the laser energy projected onto pixels in a bottom line of one block and the intensity of the laser energy projected onto pixels in a top line of a block next to the one block.

As a result, the crystalline semiconductor film formed on the gate electrode in a pixel in the bottom line of the one block and the crystalline semiconductor film formed on the gate electrode in a pixel in the top line of the next block are formed by laser irradiation at almost equal laser energy intensity. Thus, it is possible to form, in almost the same grain size, the crystalline semiconductor film in the bottom line of the one block and the crystalline semiconductor film in the top line of the next block.

In other words, the energy intensity is serially smooth when viewing, in the column direction of the pixels, the energy intensity distribution of the laser beam projected onto the entire amorphous semiconductor film. This accordingly allows suppressing variation in TFT characteristics in the entire substrate.

Second Embodiment

Figure 14:
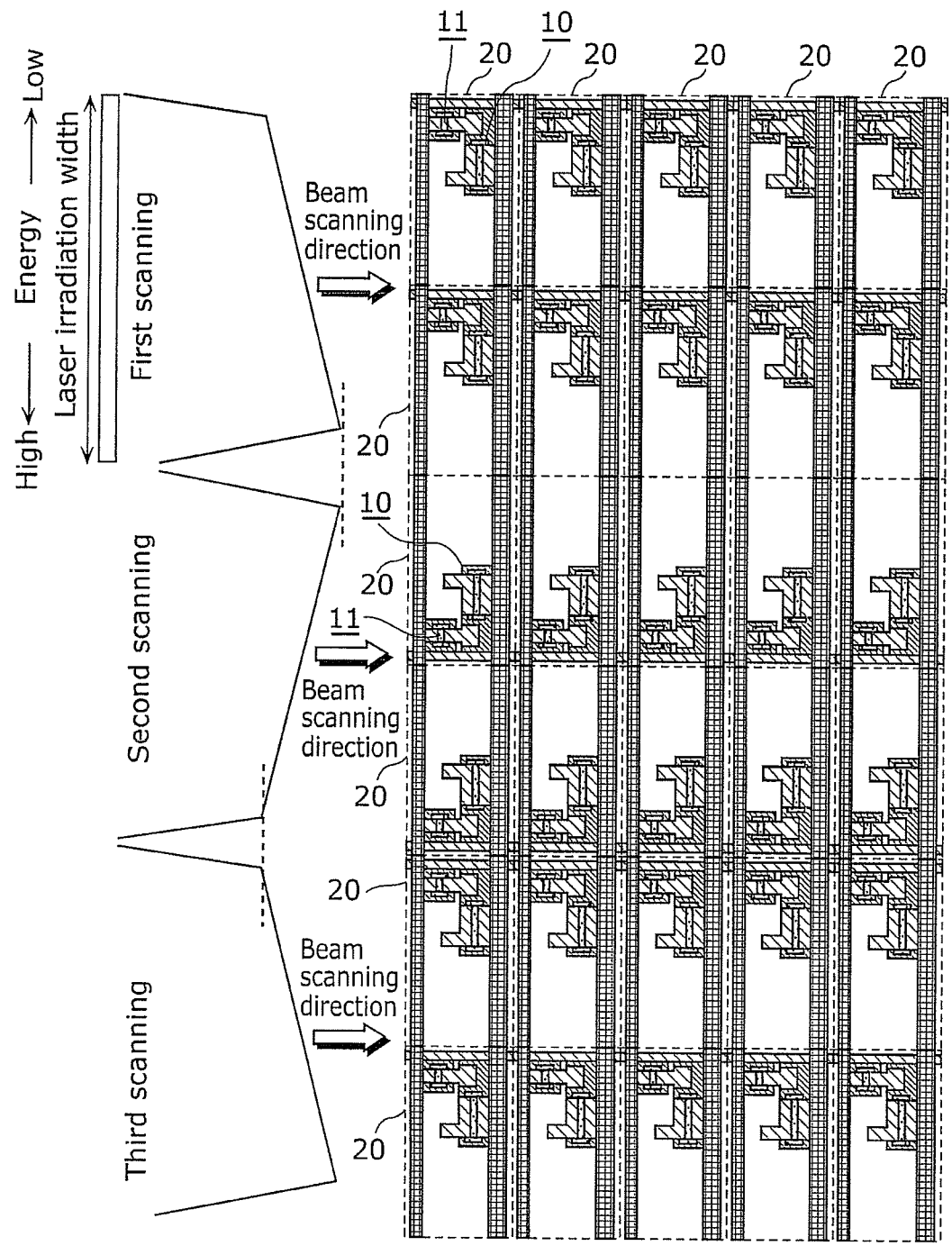
FIG. 14 is a diagram showing details of a relationship between a light intensity distribution of the laser beam and pixels in beam scanning in the laser annealing method according to a second embodiment of the present invention.

Next, a crystalline semiconductor film manufacturing method according to a second embodiment of the present invention will be described with reference to FIG. 14. FIG. 14 is a diagram showing details of a relationship between a light intensity distribution of the laser beam and pixels in the beam scanning by the laser annealing method according to the second embodiment of the present invention. Note that in FIG. 14, the same constituent elements as those shown in FIG. 7 are assigned with the same numerical references, and the descriptions thereof are omitted. Note that FIG. 14 shows, for each pixel 20, two TFTs that are the driving TFT 10 and the switching TFT 11, but when performing laser annealing, the source and drain electrodes of the driving TFT 10 and the switching TFT 11 are not formed yet, and the amorphous semiconductor film is formed in the top face.

In addition, the crystalline semiconductor film manufacturing method according to the second embodiment of the present invention and the crystalline semiconductor film manufacturing method according to the first embodiment of the present invention are basically the same. In other words, the crystalline semiconductor film according to the second embodiment of the present invention is also manufactured according to the manufacturing method as shown in FIGS. 4 and 5.

The crystalline semiconductor film manufacturing method according to the second embodiment of the present invention is different from the crystalline semiconductor film manufacturing method according to the first embodiment of the present invention in terms of layout of the pixels 20 in the TFT array substrate.

In the present embodiment, as shown in FIG. 14, as with the first embodiment, the gate electrode in each pixel 20 is provided, inside each pixel 20, at a position that is closer to one end portion of the pixel 20 from a virtual pixel center line running along the scanning direction of the laser beam. In the present embodiment, as shown in FIG. 14, the configuration is such that the driving TFT 10 and the switching TFT 11 are provided at a position closer to the gate line.

Furthermore, in the present embodiment, the gate electrode in each pixel 20 is provided at a position closer to the other end portion of the pixel 20, for each laser irradiation width of the laser beam. In other words, for each block corresponding to a laser irradiation width, the gate electrode is provided such that this biased layout of the driving TFT 10 and the switching TFT 11 is alternately inverted for each block corresponding to the laser irradiation width.

In addition, the laser irradiation according to the present embodiment, as with the first embodiment, is performed such that the laser energy intensity is inverted in increments of n pixels (per block), alternately between one end portion and the other end portion of the laser irradiation width. In other words, the configuration is such that the light intensity distribution of the laser beam is alternately inverted for each block. Note that the laser annealing according to the present embodiment can be performed using the same crystalline semiconductor film manufacturing apparatus as the apparatus used in the first embodiment.

As described above, with the crystalline semiconductor film manufacturing method according to the second embodiment of the present invention, it is possible to produce the same advantageous effect as the first embodiment described earlier.

Furthermore, the crystalline semiconductor film manufacturing method according to the second embodiment of the present invention is a method of inverting the light intensity distribution of the laser beam per block as well as inverting the layout of the pixels 20 per block according to a symmetry of the light intensity of the inverted laser beam.

With this, each of the gate electrode included in a pixel in a bottom line of the laser beam irradiation width and the gate electrode included in a pixel in a top line of the next laser beam irradiation width is provided at a position equidistant from the position of a boundary between the laser irradiation widths of the laser beam. Since such pixel layout allows performing laser irradiation, at almost equal laser energy intensity, on the amorphous semiconductor film formed on the gate electrodes in the entire pixel area, it is possible to form the crystalline semiconductor film whose grain size has high in-plane uniformity.

Accordingly, since this allows further preventing the TFT characteristics from varying depending on the position of the boundary between the laser irradiation widths of the laser beam, it is possible to further prevent the phenomenon in which a stripe or line appears along the laser irradiation width of the laser beam when viewed as the entire display apparatus. Thus, it is possible to realize a display device having high-quality image display performance.

Thus far, the crystalline semiconductor film manufacturing method and the crystalline semiconductor film manufacturing apparatus according to the present invention have been described based on the embodiments, but the present invention is not limited to these embodiments described above.

For example, in the embodiments described above, the pixels have been divided in units of two lines to constitute one block, but this is not the only case; for example, pixels in 10 lines or 100 lines may constitute one block. In addition, as a preferred example, a specific example has been described above in which the number of pixel rows in one block is determined according to the laser irradiation width of the laser beam, but the present invention is not limited to this.

In addition, the bottom gate thin film transistor has been described in the embodiments above, but the present invention is also applicable to a top gate thin-film transistor.

In addition, the thin-film transistor according to the embodiments above is applied to the TFT array substrate in the organic EL display apparatus, but may also be applied to the TFT array substrate of the liquid crystal display apparatus. In addition, a display apparatus including a thin-film transistor according to the present embodiment, such as the organic EL display apparatus or the liquid crystal display apparatus, is available as a flat panel display, and is applicable to an electronic device such as a television set, a personal computer, or a cellular phone. Note that for the television set, any one of the television broadcasting methods may be used: NTSC method, PAL method, and SECAM method. For example, the appropriate scanning method as descried above with reference to three specific examples is applicable to any one of the television broadcast methods.

Note that although only exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

A thin-film transistor array apparatus and an organic EL display apparatus according to the present invention are widely applicable in an electronic device such as a display device in a television set, a personal computer, a cellular phone, and so on.

What is claimed is:

1. A crystalline semiconductor film manufacturing method comprising:
   forming a metal layer above a substrate;
   forming a plurality of gate electrodes by patterning the metal layer such that each of pixels arranged in a matrix includes at least one of the gate electrodes;
   forming a gate insulating film on the gate electrodes;
   forming an amorphous semiconductor film on the gate insulating film; and
   forming a crystalline semiconductor film by irradiating or by scanning the amorphous semiconductor film with a predetermined laser beam, so as to crystallize the amorphous semiconductor film,
   wherein a laser irradiation width that is a width of the predetermined laser beam for the scanning corresponds to n times a width of the pixel where n is an integer equal to or above 2,
   a laser energy intensity is higher in one end portion of the laser irradiation width than in the other end portion of the laser irradiation width, and
   in the forming of a crystalline semiconductor film, the laser energy intensity of the predetermined laser beam is inverted in increments of n pixels, alternately between the one end portion and the other end portion of the laser irradiation width.

2. The crystalline semiconductor film manufacturing method according to claim 1,
   wherein in the forming of a crystalline semiconductor film, when performing laser irradiation on the amorphous semiconductor film, the amorphous semiconductor film is irradiated with the predetermined laser beam at a constant scanning speed in a region in which the amorphous semiconductor is formed.

3. A crystalline semiconductor film manufacturing method comprising:
   forming a metal layer above a substrate;
   forming a plurality of gate electrodes by patterning the metal layer such that each of pixels arranged in a matrix includes at least one of the gate electrodes;
   forming a gate insulating film on the gate electrodes;
   forming an amorphous semiconductor film on the gate insulating film; and
   forming a crystalline semiconductor film by irradiating or by scanning the amorphous semiconductor film with a predetermined laser beam, so as to crystallize the amorphous semiconductor film,
   wherein a laser irradiation width that is a width of the predetermined laser beam for the scanning corresponds to n times a width of the pixel where n is an integer equal to or above 2,
   a laser energy intensity is higher in one end portion of the laser irradiation width than in the other end portion of the laser irradiation width,
   the pixel includes the at least one of the gate electrodes at a position closer to one end portion of the pixel from a virtual pixel center line of the pixel, the virtual center line running along a scanning direction of the predetermined laser beam,
   the pixel includes the at least one of the gate electrodes, for each laser irradiation width of the predetermined laser beam, at a position closer to the other end portion of the pixel, and
   in the forming of a crystalline semiconductor film, the laser energy intensity of the predetermined laser beam is inverted in increments of n pixels, alternately between the one end portion and the other end portion of the laser irradiation width.

* * * * *